United States Patent
Hayashi et al.

(10) Patent No.: US 7,465,618 B2
(45) Date of Patent: Dec. 16, 2008

(54) SEMICONDUCTOR DEVICE AND METHOD FOR FABRICATING THE SAME

(75) Inventors: Shigenori Hayashi, Nara (JP); Kazuhiko Yamamoto, Osaka (JP)

(73) Assignees: Panasonic Corporation, Osaka (JP); Interuniversitair Micro-Elektronica Centrum VZW, Leuven (BE)

( * ) Notice: Subject to any disclaimer, the term of this patent is extended or adjusted under 35 U.S.C. 154(b) by 161 days.

(21) Appl. No.: 11/411,932

(22) Filed: Apr. 27, 2006

(65) Prior Publication Data

US 2006/0281264 A1 Dec. 14, 2006

(30) Foreign Application Priority Data

Jun. 9, 2005 (JP) ............... 2005-170210

(51) Int. Cl.
H01L 21/336 (2006.01)
H01L 21/8234 (2006.01)
H01L 21/587 (2006.01)

(52) U.S. Cl. .............. 438/197; 438/287; 438/585; 438/587; 257/E21.177; 257/E21.29

(58) Field of Classification Search .............. 438/287, 438/142, 453, 763, 785, 591; 257/287, 412, 257/E21.29, E21.296, E21.177
See application file for complete search history.

(56) References Cited

U.S. PATENT DOCUMENTS 7,268,047 B2 * 9/2007 Arikado et al. ............. 438/287

2002/0153579 A1 * 10/2002 Yamamoto ................. 257/412
2006/0189154 A1 * 8/2006 Ahn et al. .................. 438/763

FOREIGN PATENT DOCUMENTS

| JP | 5-13706 A | 1/1993 |
|----|-----------|--------|
| JP | 2000-58832 A | 2/2000 |
| JP | 2001-160557 A | 6/2001 |

OTHER PUBLICATIONS

Masahiko Hiratani, et al., "Effective Electron Mobility Reduced by Remote Charge Scattering in High- κ Gate Stacks," Jpn. J. Appl. Phys., Jul. 2002, pp. 4521-4522, vol. 41, Part 1, No. 7A, The Japan Society of Applied Physics.
C. Hobbs, et al., "Fermi Level Pining at the PolySi/Metal Oxide Interface," 2003 Symposium on VLSI Technology Digest Technical Papers.
Masahiko Hiratani, et al. "Scaling limit of high- κ gate dielectrics," Semiconductor Integrated Circuit Symposium, Dec. 13-14, 2001, pp. 79-84.
V.N. Parfenekov, et al., "Dokl. Akad. Nauk SSSR," 1969, 185[4]840.
N.A. Torpov, et al., "Izv. Akad. Nauk SSSR," 1961, Otd. Khim. Nauk 4, 547.

* cited by examiner

Primary Examiner—Scott B. Geyer
Assistant Examiner—Mohsen Ahmadi
(74) Attorney, Agent, or Firm—McDermott Will & Emery LLP

(57) ABSTRACT

A semiconductor device includes: a semiconductor substrate; a gate insulating film formed on the semiconductor substrate and made of a high-dielectric-constant material composed of a plurality of layers stacked perpendicularly to a principal surface of the semiconductor substrate and associated with respective phases; and a gate electrode formed on the gate insulating film.

5 Claims, 14 Drawing Sheets

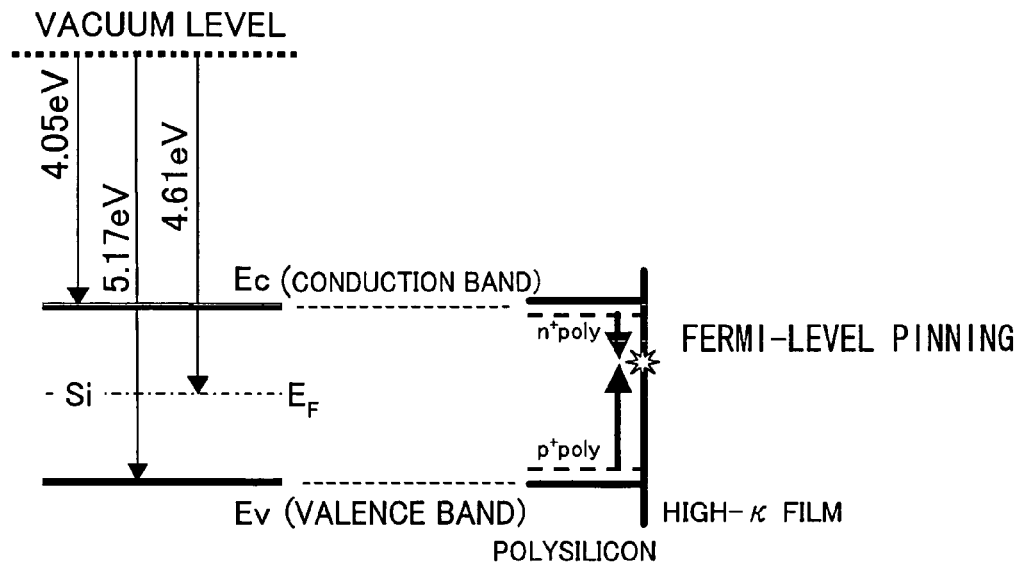
FIG. 18A          FIG. 18B
FIG. 19
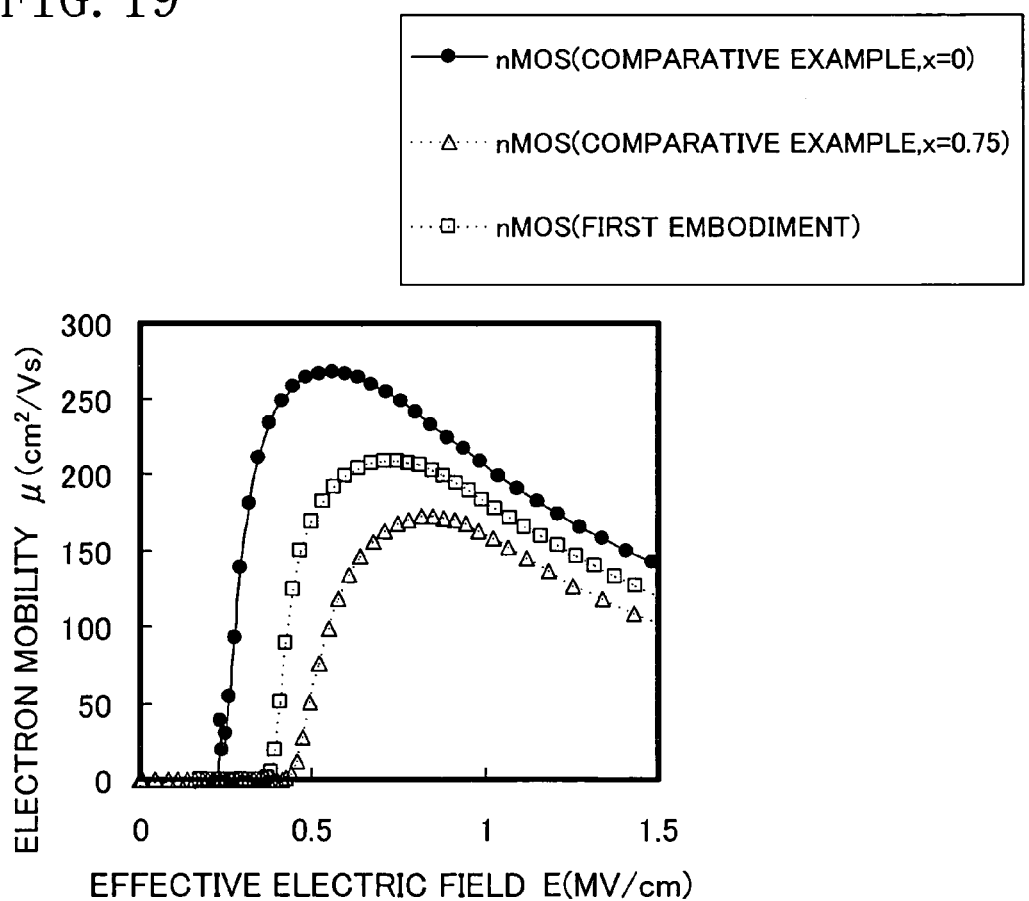

SEMICONDUCTOR DEVICE AND METHOD FOR FABRICATING THE SAME

CROSS-REFERENCE TO RELATED APPLICATION

The disclosure of Japanese Patent Application No. 2005-170210 filed on Jun. 9, 2005 including specification, drawings and claims is incorporated herein by reference in its entirety.

BACKGROUND OF THE INVENTION

The present invention relates to semiconductor devices, and particularly relates to a MOS device including a gate insulating film made of a dielectric material having a high dielectric constant (hereinafter, referred to as a high-κ material) and a method for fabricating the device.

With recent increase in the integration degree and speed of semiconductor integrated circuit devices and expansion of the functionality thereof, the size of metal-oxide-semiconductor field effect transistors (MOSFETs) has been reduced. As the thickness of a gate insulating film decreases in accordance with this size reduction, the problem of increased gate leakage current caused by tunnel current comes to the surface. To solve this problem, there has been developed a technique with which a high-κ material of metal oxide such as hafnium oxide ($HfO_2$) or zirconium oxide ($ZrO_2$) is used for a gate insulating film so that the equivalent oxide thickness EOT is reduced with a physical thickness increased. The equivalent oxide thickness EOT is herein a thickness calculated from the thickness of a film made of a dielectric having a relative dielectric constant different from that of silicon oxide ($SiO_2$) in terms of the relative dielectric constant of silicon oxide.

In the initial stage of development, the use of a gate insulating film made of metal oxide such as $HfO_2$ or $ZrO_2$ causes a problem in which an interface layer is formed between a silicon substrate and the gate insulating film. This interface layer has a low dielectric constant, so that the effective relative dielectric constant of the gate insulating film decreases, i.e., the equivalent oxide thickness EOT increases. Therefore, it was necessary to suppress formation of such an interface layer as much as possible. However, once the formation of an interface layer was successfully suppressed so that a high effective relative dielectric constant of the gate insulating film is maintained, i.e., the equivalent oxide thickness EOT is reduced afterward, there arises another problem in which carrier mobility deteriorates as compared to the case of a silicon oxide film and, consequently, desired operating current cannot be obtained. It has been considered that a cause of this problem is that (1) fixed charge included in a high-κ material electrically interferes with carriers in channel to cause the carrier mobility to deteriorate or (2) carriers in channel are scattered by a lattice in the high-κ material to cause the carrier mobility to deteriorate, for example. In non-patent literature 1 (M. Hiratani, S. Saito, Y. Shimamoto, and K. Torii, "Effective Electron Mobility Reduced by Remote Charge Scattering in High-κ Gate Stacks", Jpn. J. Appl. Phys., Part 1 84, (2002) pp. 4521-4522), for example, a relationship between the mobility and the thickness of a silicon oxide film formed at the interface between a silicon substrate and a gate insulating film. According to this relationship, to avoid deterioration of the carrier mobility, channel (a substrate) and a high-κ material (a gate insulating film) are preferably separated from each other or a silicate structure in which a metal concentration in the entire high-κ material is reduced is preferably used. However, since the interface layer made of, for example, a silicon oxide film has a low relative dielectric constant, the effective relative dielectric constant of the gate insulating film extremely decreases, i.e., the equivalent oxide thickness EOT increases, in a case where the thickness of the interface layer is relatively large or in the case of a silicate structure in which the metal concentration is relatively low. Accordingly, each of a structure including an interface layer and a structure having a reduced metal concentration has a trade-off relationship with the case of not adopting these structures.

In addition, in recent yeas, there arises another problem in which the absolute value of the threshold voltage $V_t$ during transistor operation increases due to reaction at the upper interface of the gate insulating film, i.e., reaction between materials for the gate insulating film and the gate electrode. Though a cause of this problem is unclear, it is reported that exposure of a substrate to a process at a high temperature of about 1000° C. in a transistor fabrication process such as activation performed on ions implanted in source/drain regions causes a gate-electrode material and an gate-insulating-film material to react with each other, so that an effective work function of the gate-electrode material varies. This phenomenon is called Fermi-level pinning. For example, in non-patent literature 2 (C. Hobbs, L. Fonseca, V. Dhandapani, S. Samavedam, B. Taylor, J. Grant, L. Dip, D. Triyoso, R. Hegde, D. Gilmer, R. Garcia, D. Roan, L. Lovejoy, R. Rai, L. Hebert, H. Tseng, B. White, and P. Tobin, "Fermi level pinning at the polySi/metal oxide interface", Proceedings of the 2003 Symposium on VLSI Technology, (2003), pp. 9-10), it is reported that in a case where a gate-electrode material is polysilicon, the effective work function of this polysilicon is fixed at a position near the midgap (i.e., the intermediate value of band gap energy) of silicon and toward $n^+$ polysilicon, irrespective of the type of the dopant for polysilicon and, as a result, the absolute value of the threshold voltage $V_t$ of a pFET is considerably large. As a method for suppressing increase of the absolute value of the threshold voltage $V_t$ resulting from the Fermi-level pinning, methods such as a method of providing a thin buffer layer made of, for example, silicon nitride (SiN) in the interface between a gate electrode and a gate insulating film and a method employing a silicate structure in the entire part of which the metal concentration is reduced as a gate insulating film have been examined. However, even these methods have a problem in which the dielectric constant of the buffer layer is lower than that of the high-κ material and the buffer layer is grown to be an island shape during deposition thereof so that the thickness needs to be large. In addition, the silicate structure having a low metal concentration causes a problem in which the effective dielectric constant of the gate insulating film is extremely reduced (i.e., the equivalent oxide thickness EOT is increased) as described above. Accordingly, each of the structure including a buffer layer and the structure with a reduced metal concentration has a trade-off relationship with the case of not adopting these structures.

Accordingly, in the case of using the high-κ material for a gate insulating film, to solve the problem of deterioration of carrier mobility in the lower interface (substrate interface) and the problem of Fermi-level pinning occurring in the upper interface (gate-electrode interface), it is necessary to provide an interface layer (an underlying film) and a buffer film such that distances are kept from the gate insulating film to the respective interfaces with the substrate and the gate electrode or to optimize the structure of the high-κ film, e.g., to reduce the metal concentration, in consideration of the trade-off of increase of the equivalent oxide thickness EOT.

For a MOSFET using a gate insulating film made of a conventional high-κ material, setting and optimization of an underlying film and a buffer film, optimization of the metal concentration in a high-κ film and change and optimization of the metal concentration profile are proposed so as to avoid deterioration of carrier mobility and occurrence of Fermi-level pinning.

However, these proposals have new problems dependent on a high-κ film deposition mechanism such as island-shape growth dependent on the underlying film as well as the buffer film and thermodynamic instability of the designed film structure.

For example, as illustrated in FIG. 11A, an underlying film 2 made of silicon oxide, a gate insulating film 3 made of metal oxide having a high dielectric constant, and a gate electrode 3 made of polysilicon are deposited in this order over a substrate 1 made of silicon so as to obtain the gate insulating film 3 having a metal concentration of about 70%, for example. However, the substrate is exposed to high-temperature processes during deposition of films and transistor formation, resulting in that the gate insulating film is separated into phases which are thermodynamically stable and have different metal concentrations, as illustrated in FIG. 11B. Specifically, the gate insulating film is three-dimensionally separated into phases: a high-κ stable phase 3a having a high dielectric constant and a low-κ stable phase 3b having a dielectric constant lower than that of the high-κ stable phase 3a, so that grain boundary is formed in the thickness direction. Along the grain boundary extending in the thickness direction, leakage current 5 flows in the substrate 1, so that the film properties of the gate insulating film 3 deteriorate.

Whether the specific phase is stable or not depends on the type of a metal element in a high-κ film. This can be estimated to some extent from, for example, the $HfO_2$—$SiO_2$ phase diagram in FIG. 12, the $ZrO_2$—$SiO_2$ phase diagram in FIG. 13 and the $Y_2O_3$—$SiO_2$ phase diagram in FIG. 14 disclosed in non-patent literature 3 (M. Hiratani, K. Torii, and Y. Shimamoto, "Scaling Limitation of High-κ Gate Insulating Film" Semiconductor Integrated Circuit Symposium, Dec. 13 to 14 (2001), pp. 79-84), non-patent literature 4 (V. N. Parfenekov, R. G. Grebenshcikov and N. A. Torpov, Dokl. Akad. Nauk SSSR, 185[4]840 (1969)) and non-patent literature 5 (N. A. Torpov and I. A. Bonder, Izv. Akad. Nauk SSSR, Otd. Khim. Nauk 4, 547 (1961)), respectively, but depends on the thin-film effect and factors other than temperature. In FIGS. 12, 13 and 14, Liquid (L) represents a liquid phase, tet represents a tetragonal crystal layer, mon represents monoclinic phase, Trd represents tridimite phase, and Crs (Crist) represents a cristobalite phase.

SUMMARY OF THE INVENTION

It is therefore an object of the present invention to prevent deterioration of carrier mobility and increase of the absolute value of a threshold voltage with thermodynamically stable characteristics, in a transistor including a gate insulating film using a high-κ material.

To achieve the object, according to the present invention, a capacitive insulating film made of a high-κ dielectric in a MOS device is separated into a plurality of layers associated with respective phases in the thickness direction.

Specifically, a semiconductor device according to the present invention includes: a semiconductor substrate; a gate insulating film formed on the semiconductor substrate and made of a high-dielectric-constant material composed of a plurality of layers stacked perpendicularly to a principal surface of the semiconductor substrate and associated with respective phases; and a gate electrode formed on the gate insulating film.

In the semiconductor device according to the present invention, a gate insulating film has a structure using only thermodynamically-stable phases beforehand, so that no additional three-dimensional phase separation occurs even when the film is exposed to high-temperature processes during deposition and for forming a transistor. In addition, the grain boundary is kept separated in the direction (thickness direction) perpendicular to the substrate, so that an excellent insulating property is maintained. As a result, gate leakage current is prevented.

In the semiconductor device according to the present invention, in the gate insulating film, one of the layers associated with a first stable phase having a low dielectric constant is preferably located on the semiconductor substrate. Then, the number of metal atoms in the high-κ film serving as a factor of carrier scattering is reduced on the channel region of the semiconductor substrate, so that deterioration of carrier mobility is suppressed.

In the semiconductor device according to the present invention, in the gate insulating film, one of the layers associated with a first stable phase having a low dielectric constant is preferably located on the gate electrode. Then, the number of metal atoms in the high-κ film causing Fermi-level pinning is reduced, so that deterioration of the effective work function in a gate-electrode material, i.e., increase of the work function in an nMOSFET and decrease of the work function in a pMOSFET, is suppressed. According to the present invention, the first stable phase is formed by phase separation in a self alignment manner through heat treatment, so that as in the case of forming a buffer layer on the gate insulating film, deterioration of the work function is suppressed without the need for a large thickness to prevent island-shape growth.

In the semiconductor device according to the present invention, it is preferable that the gate electrode is made of polysilicon, and the high-dielectric-constant material contains at least one material selected from the group consisting of silicon, germanium, hafnium, zirconium, titanium, tantalum, aluminum and a rare-earth metal.

In this case, it is preferable that the high-dielectric-constant material is made of hafnium silicate ($Hf_xSi_{1-x}O_4$), a Hf concentration x of the first stable phase is 0.1<x <0.4, and a Hf concentration x of a second stable phase associated with another layer in the gate insulating film is 0.5 or 1.0.

A first method for fabricating a semiconductor device according to the present invention includes the steps of: forming, by chemical vapor deposition, a gate insulating film made of a plurality of high-dielectric-constant thin films associated with respective thermodynamically-stable phases and having different dielectric constants, on a semiconductor substrate; and forming a gate electrode on the gate insulating film, wherein the phases are stacked perpendicularly to a principal surface of the semiconductor substrate.

With the first method, a gate insulating film made of a plurality of high-dielectric-constant thin films associated with respective thermodynamically-stable phases and having different dielectric constants is formed by phase separation in the direction perpendicular to the principal surface of a semiconductor substrate. Accordingly, even when the film is exposed to high-temperature processes during deposition and for forming a transistor, no three-dimensional phase separation occurs. In addition, the grain boundary is kept separated in the direction (thickness direction) perpendicular to the substrate, so that an excellent insulating property is maintained. As a result, gate leakage current is prevented.

A second method for fabricating a semiconductor device according to the present invention includes the steps of: forming, by atomic layer deposition, a gate insulating film made of a plurality of high-dielectric-constant thin films at a thermodynamically-stable atomic-layer ratio and having different dielectric constants, on a semiconductor substrate; and forming a gate electrode on the gate insulating film, wherein the gate insulating film is composed of phases stacked perpendicularly to a principal surface of the semiconductor substrate.

With the second method, a gate insulating film made of a plurality of high-dielectric-constant thin films at a thermodynamically-stable atomic-layer ratio and having different dielectric constants is formed by phase separation in the direction perpendicular to the principal surface of a semiconductor substrate. Accordingly, even when the film is exposed to high-temperature processes during deposition and for forming a transistor, no three-dimensional phase separation occurs. In addition, the grain boundary is separated in the direction (thickness direction) perpendicular to the substrate, so that an excellent insulating property is maintained. As a result, gate leakage current is prevented.

In the first or second method, it is preferable that in the step of forming the gate insulating film, each of the high-dielectric-constant thin films is deposited at a temperature at which an amorphous phase of the high-dielectric-constant thin film is maintained, and the method further comprises the step of performing a heat treatment on the gate insulating film at a temperature enough to make each of the phases stable, before the step of forming the gate electrode. Then, occurrence of additional phase separation of the phase insulating film separated into phases is further prevented.

A third method for fabricating a semiconductor device according to the present invention includes the steps of: depositing an alloy film containing at least two metal elements by physical vapor deposition on a semiconductor substrate; performing oxidization on the alloy film, thereby forming a gate insulating film made of a plurality of high-dielectric-constant thin films having different dielectric constants; and forming a gate electrode on the gate insulating film, wherein the gate insulating film is composed of phases stacked perpendicularly to a principal surface of the semiconductor substrate.

With the third method, a gate insulating film made of a plurality of high-dielectric-constant thin films having different dielectric constants is formed by phase separation in the direction perpendicular to the principal surface of a semiconductor substrate by oxidizing a deposited alloy film. Accordingly, even when the film is exposed to high-temperature processes during deposition and for forming a transistor, no three-dimensional phase separation occurs. In addition, the grain boundary is separated in the direction (thickness direction) perpendicular to the substrate, so that an excellent insulating property is maintained. As a result, gate leakage current is prevented.

In the third method, in the step of depositing the alloy film, composition of the alloy film is preferably changed along a thickness direction of the alloy film. Then, a stable phase having a relatively low dielectric constant is provided near the substrate or the gate electrode, so that deterioration of carrier mobility and deterioration (variation) of the work function are suppressed.

In the third method, it is preferable that in the step of forming the gate insulating film, the oxidation is performed at a temperature at which an amorphous state of each of the high-dielectric-constant thin films is maintained, and the method further comprises the step of performing a heat treatment on the gate insulating film at a temperature enough to make each of the phases stable, before the step of forming the gate electrode. Then, the gate insulating film is separated into phases in the thickness direction in a self-alignment manner during oxidation and subsequent high-temperature heat treatment.

The first through third methods preferably further includes the step of performing nitridation on the gate insulating film, between the step of performing the heat treatment at a temperature at which the phases are stable and the step of forming the gate electrode. Then, a defect occurring in the gate insulating film made of a high-κ dielectric is compensated and, in addition, the equivalent oxide thickness of the gate insulating film is reduced.

With semiconductor devices and methods for fabricating the devices according to the present invention, in a transistor including a gate insulating film using a high-κ material, deterioration of carrier mobility and increase of the absolute value of a threshold voltage are prevented and thermodynamically stable characteristics are obtained.

BRIEF DESCRIPTION OF THE DRAWINGS

FIG. 11A is a cross-sectional view illustrating a structure immediately after deposition and FIG. 11B is a cross-sectional view illustrating a structure after heat treatment.

FIG. 18A is a band diagram of silicon according to the comparative example and FIG. 18B is a band diagram showing Fermi-level pinning occurring in polysilicon (a gate electrode) in the case of using a high-κ material for a gate insulating film.

FIG. 19 is a graph showing electron mobility in nMOSFETs using gate insulating films formed in the first embodiment and the comparative example.

DETAILED DESCRIPTION OF THE INVENTION

Comparative Example

As a comparative example for embodiments of the present invention, a method for forming a conventional gate insulating film using a metal oxide film made of a high-κ dielectric will be described with reference to FIGS. 15A through 15C.

Figure 15A:
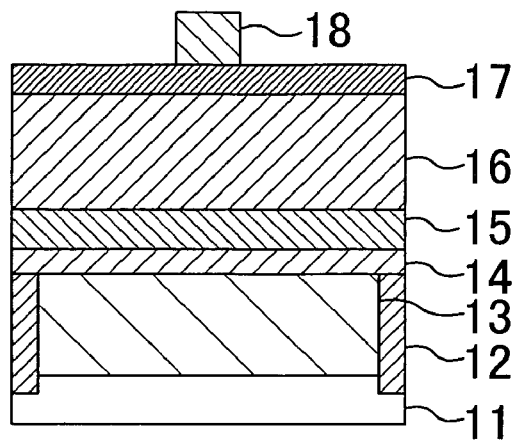
FIGS. 15A through 15C are cross-sectional views illustrating respective process steps of a method for fabricating a semiconductor device according to a comparative example.

First, as shown in FIG. 15A, an isolation film 12 serving as a shallow trench isolation (STI) is selectively formed in an upper portion of a substrate 11 made of silicon (Si) and having a principal surface whose plane orientation is the (100) plane, for example. Subsequently, by ion implantation, a p-well 13 is formed for an nMOSFET and an n-well 13 is formed for a pMOSFET, in an upper portion of the substrate 11. In this manner, a plurality of device regions are formed in the principal surface of the substrate 11. Thereafter, the surface of the substrate 11 is subjected to known standard RCA cleaning and dilute hydrofluoric acid (HF) cleaning in this order. Then, heat treatment is performed on the substrate 11 at a temperature of about 600° C. to about 700° C. in an oxygen atmosphere, for example. In this manner, an underlying film 14 made of silicon oxide ($SiO_2$) and having a thickness of about 0.5 nm is formed on the device regions in the substrate 11.

Next, a metal oxide film 15 made of a high-κ dielectric is deposited by, for example, a metal-organic chemical vapor deposition (MOCVD) process to a thickness of about 3 nm over the underlying film 14.

Specifically, bubbling is performed by blowing a carrier gas containing, for example, nitrogen ($N_2$) into Hf (O-t-$C_3H_7)_4$ as a liquid Hf source and Si(O-t-$C_3H_7)_4$ as a liquid Si source. In this manner, a source gas in which the liquid Hf source and the liquid Si source are in gaseous form is introduced into a reaction chamber together with the carrier gas. Then, a metal oxide film 15 made of hafnium silicate ($Hf_xSi_{1-x}O_4$) is deposited with the temperature in the chamber set at about 500° C. At this time, the Hf concentration x with respect to Si is appropriately changed by adjusting the supply amounts of the Hf source and the Si source.

Thereafter, heat treatment is performed at a temperature of about 700° C. to about 1000° C. so as to make the film sustainable under a compensation step for deficiency caused by removal of a remaining impurity such as carbon (C) or hydrogen (H) and nitridation and under a thermal budget in a subsequent high-temperature process. The heating atmosphere at this time is preferably a nitrogen ($N_2$) atmosphere containing a trace amount of oxygen ($O_2$) or an ammonium ($NH_3$) atmosphere so as to prevent a large change in thickness of the underlying film 14 between the substrate 11 and the metal oxide film 15. In a case where the Hf concentration x in hafnium silicate ($Hf_xSi_{1-x}O_4$) is one, i.e., $HfO_2$ is used for the metal oxide film 15, it is not preferable to make $HfO_2$ exposed to an ammonium atmosphere because $HfO_2$ is reduced to generate hafnium nitride (HfN) having conductivity. Accordingly, in this case, a cap layer made of silicon nitride (SiN) and having a thickness of about 0.5 nm is preferably deposited by a CVD deposition process over the metal oxide film 15 made of $HfO_2$. Then, the cap layer enables compensation for deficiency in the upper face of the metal oxide film 15 and near the upper face.

Then, a gate-electrode film 16 having a thickness of about 100 nm and made of polysilicon doped with phosphorus (P) and a hard-mask film 17 having a thickness of about 80 nm and made of silicon oxide are deposited in this order over the metal oxide film 15 by CVD processes. Subsequently, a resist mask 18 having a gate pattern is formed on the hard-mask film 17 by lithography.

Figure 15B:
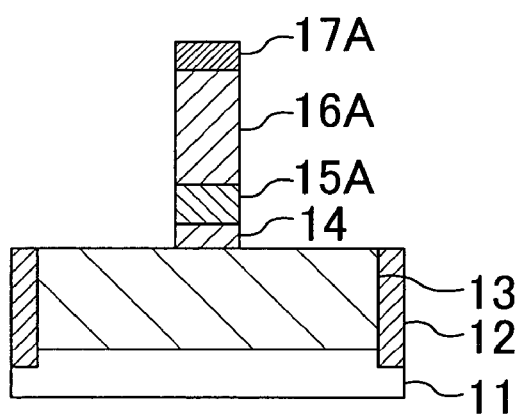
Figure 15C:
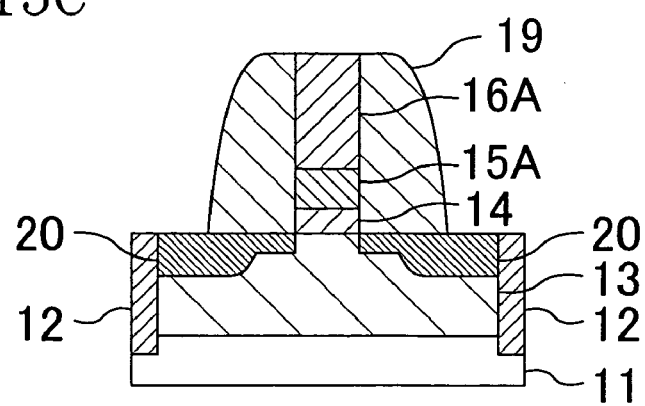

Thereafter, as shown in FIG. 15B, the hard-mask film 17 through the underlying film 14 are patterned in this order by dry etching using, for example, chlorine ($Cl_2$) gas as a main component and the resist mask 18. In this manner, a hard mask 17A is formed out of the hard-mask film 17, a gate electrode 16A is formed out of the gate-electrode film 16 and a gate insulating film 15A is formed out of the metal oxide film 15.

Subsequently, ion implantation is performed on an upper portion of the substrate 11 using the hard mask 17A. Then, side walls 19 made of silicon oxide are formed on both sides of the gate electrode 16A, and then ions are implanted again in an upper portion of the substrate 11 using the side walls 19 and the gate electrode 16A as a mask, thereby forming source/drain regions 20. Thereafter, through an interconnection process, a MOSFET as shown in FIG. 15C is obtained.

Figure 16:
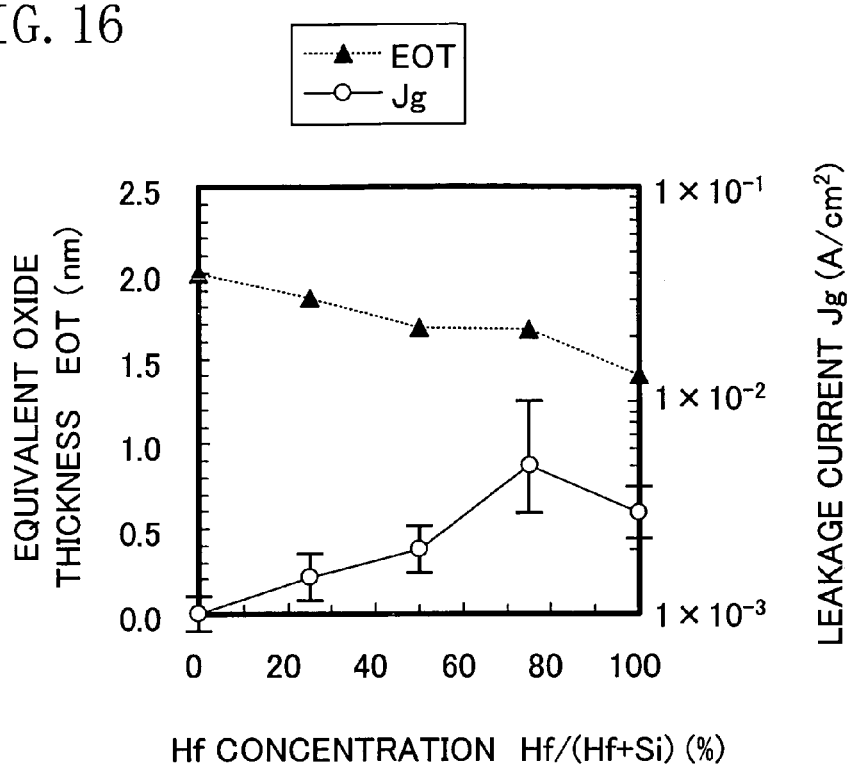
FIG. 16 is a graph showing a capacitor characteristic of a gate insulating film made of metal oxide formed in the comparative example, i.e., a relationship between the Hf concentration and the equivalent oxide thickness of hafnium silicate and a relationship between the Hf concentration and leakage current.

FIG. 16 shows a capacitor characteristic of a gate insulating film 15A of metal oxide formed in this comparative example and having a physical thickness of 3 nm. The ordinate represents the equivalent oxide thickness EOT (nm) obtained by CV measurement and the leakage current $J_g$ (A/cm$^2$) obtained by IV measurement. The abscissa represents the Hf concentration x in hafnium silicate ($Hf_xSi_{1-x}O_4$) forming the deposited metal oxide film 15. In particular, the material forming the metal oxide film 15 is silicon oxide ($SiO_2$) when x=0 and is hafnium oxide ($HfO_2$) when x=1. Strictly speaking, since the metal oxide film 15 is subjected to thermal nitridation in a nitrogen atmosphere or an ammonium atmosphere after deposition as described above, hafnium silicate itself contains nitrogen.

As shown in FIG. 16, the addition of Hf to a $SiO_2$ film increases the relative dielectric constant κ to that of $HfO_2$ in which κ is about 20. Accordingly, the equivalent oxide thickness EOT decreases monotonously. On the other hand, the leakage current $J_g$ depends on the physical thickness, and thus should be unchanged as long as the physical thickness is constant. Since the band gap in hafnium silicate gradually decreases from that of $SiO_2$, i.e., 7 eV to 8 eV, to that of $HfO_2$, i.e., 5 eV to 6 eV, the leakage current $J_g$ is expected to decrease monotonously. However, in reality, as is pronounced in the case where the Hf concentration x is 0.75 in FIG. 16, there is a trend in which the absolute value of the leakage current $J_g$ and variation thereof increase.

Figure 11A:
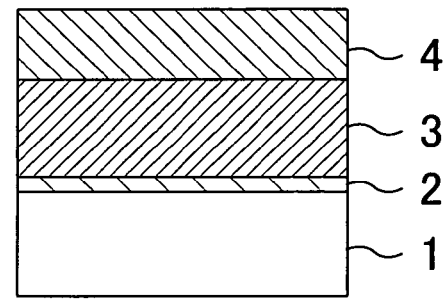
FIGS. 11A and 11B are cross-sectional views schematically illustrating a metal oxide film for forming a gate insulating film in a conventional semiconductor device.
Figure 11B:
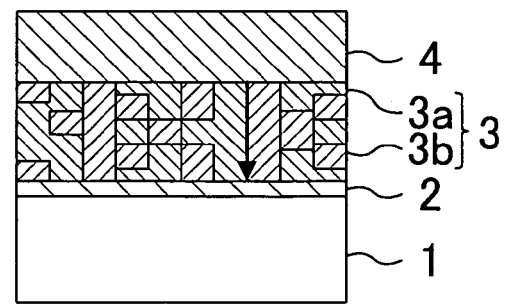
Figure 12:
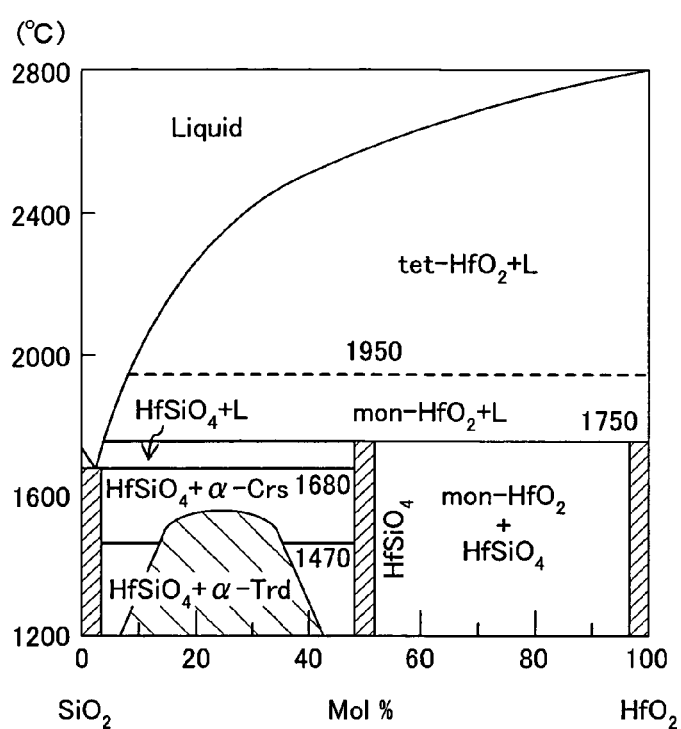
FIG. 12 is a phase diagram of metal oxide for use in a gate insulating film in the conventional semiconductor device.
Figure 13:
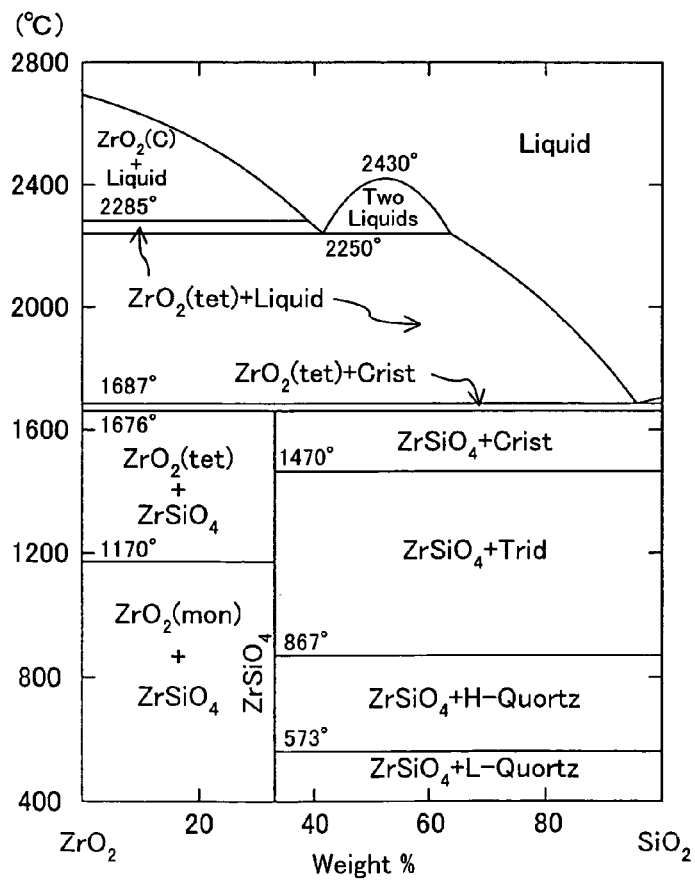
FIG. 13 is a phase diagram of another metal oxide for use in the gate insulating film in the conventional semiconductor device.
Figure 14:
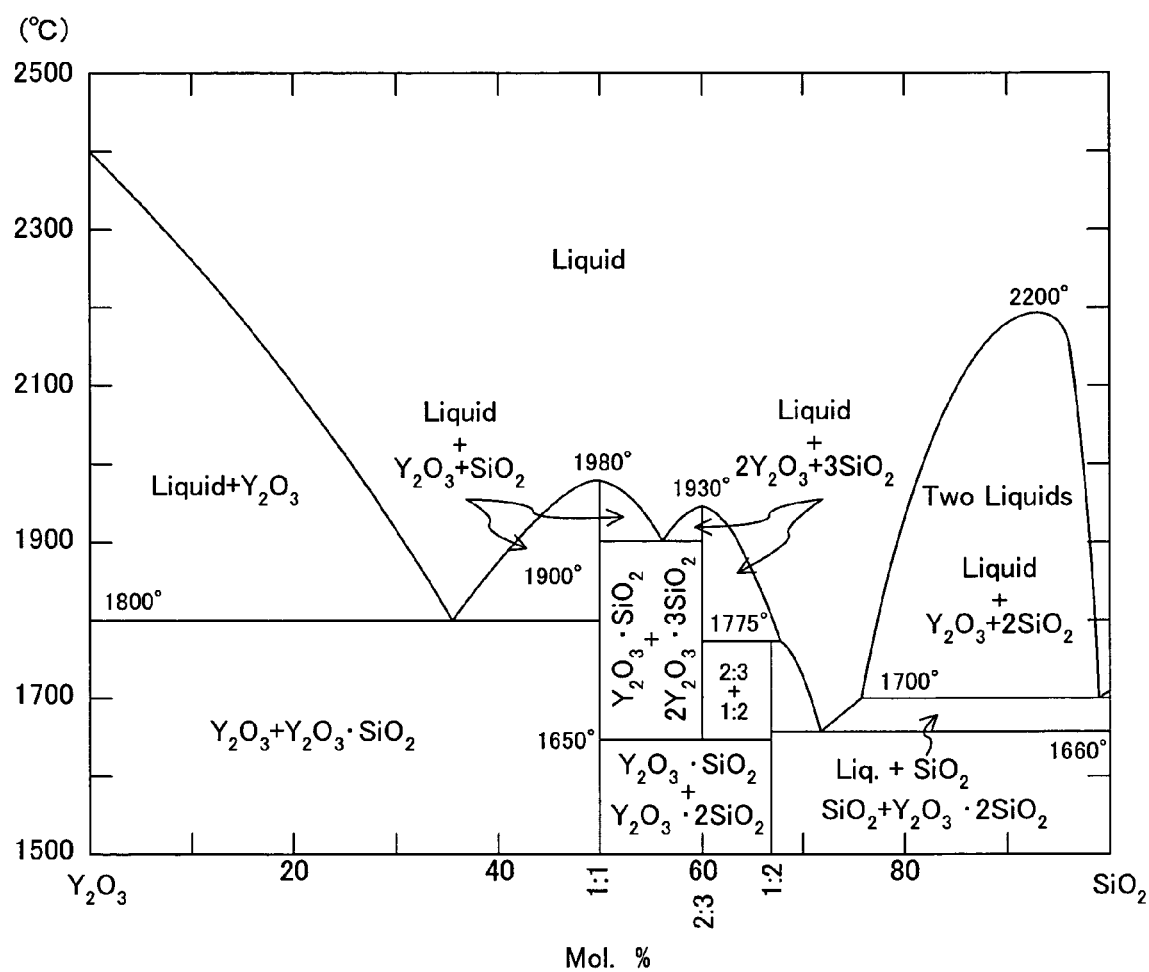
FIG. 14 is a phase diagram of another metal oxide for use in the gate insulating film in the conventional semiconductor device.

This increase of the absolute value of leakage current $J_g$ in the case where the Hf concentration x is 0.75 results from generation of stable phases expected from the phase diagram of hafnium silicate shown in FIG. 12. That is, even if homogeneous hafnium silicate having a Hf concentration x of 0.75 is to be formed, the film is separated into $HfO_2$ which is a more stable high-κ phase and $Hf_{0.5}Si_{0.5}O_2$ which is a low-κ phase by thermal budgets during deposition and a subsequent process. In addition, as shown in FIG. 11B, this phase separation occurs three-dimensionally, so that leakage current $J_g$ readily flows using the generated grain boundary as a leakage path. The absolute value of this leakage current $J_g$ and variation thereof increase depending on the relationship between the area of the transistor and the density of the leakage path.

In consideration of the foregoing results and the phase diagram shown in FIG. 12, stable phases of hafnium silicate ($Hf_xSi_{1-x}O_4$) are $SiO_2$, $Hf_{0.5}Si_{0.5}O_2$ and $HfO_2$ and a metastable phase is $Hf_{0.25}Si_{0.75}O_2$.

Figure 17:
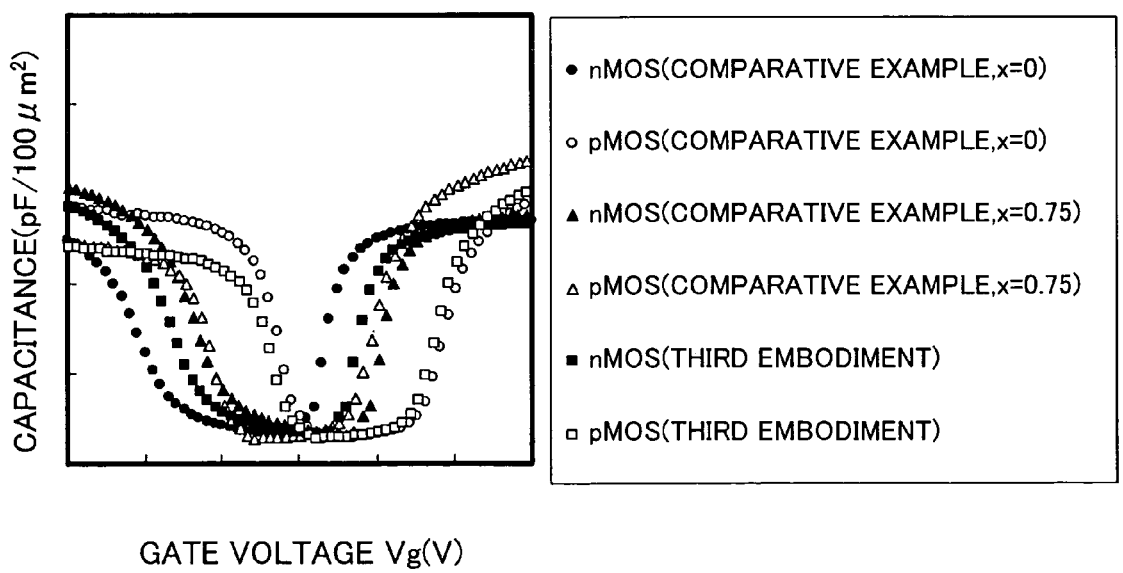
FIG. 17 is a graph showing capacitance-voltage (CV) characteristics of gate insulating films formed in the third embodiment and the comparative example

FIG. 17 shows a capacitance-voltage (CV) characteristic of the gate insulating film 15A formed in this comparative example. FIG. 17 shows cases where the Hf concentration x of hafnium silicate ($Hf_xSi_{1-x}O_4$) forming the gate insulating film 15A is 0 and 0.75. The ordinate represents the capacitance (pF/100 $\mu m^2$) and the abscissa represents the gate voltage $V_g$ (V).

As shown in FIG. 17, in the case where the Hf concentration x is zero, with respect to the CV curve of the nMOSFET (represented by ●), the flat band voltage $V_{fb}$ rises at about −1V at the accumulation side (where the gate voltage $V_g$<0) and the threshold voltage $V_t$ rises at about +0.2 V at the inversion side (where the gate voltage $V_g$>0).

With respect to the CV curve of the pMOSFET (represented by ○), the flat band voltage $V_{fb}$ rises at about +0.8V at the accumulation side (where the gate voltage $V_g$>0) and the threshold voltage $V_t$ rises at about −0.3 V at the inversion side (where the gate voltage $V_g$<0). In this case, the difference between the flat band voltage $V_{fb}$ and the threshold voltage $V_t$ is associated with 1.1 eV that is the band gap energy of silicon (Si).

The threshold voltage $V_t$ corresponds to the threshold voltage $V_t$ during transistor operation. Therefore, the absolute value of the threshold voltage $V_t$ is preferably as small as possible. Accordingly, the absolute value of the flat band voltage $V_{fb}$ is preferably as close to about 1 V as possible. This preferred state means that no Fermi-level pinning illustrated in FIG. 18B occurs and the work functions of the gate electrodes of the nMOSFET and pMOSFET, or $n^+$ polysilicon and $p^+$ polysilicon, are close to the original conduction band $E_c$ of 4.05 eV and the original valence band $E_v$ of 5.17 eV of silicon, respectively.

However, as seen from FIG. 17, in the case where the Hf concentration x is 0.75, the absolute values of the flat band voltages $V_{fb}$ in both the nMOSFET and pMOSFET, especially the pMOSFET, are small, so that the absolute values of the threshold voltages $V_t$ are large accordingly. This means that the effective work functions of $n^+$ polysilicon and $p^+$ polysilicon forming the gate electrodes of the nMOSFET and pMOSFET are close to the midgap (i.e., the intermediate energy between the valence band $E_v$ and the conduction band $E_c$) of silicon, as indicated by the vertical arrows in FIG. 18B and, more strictly, are pinned slightly toward the conduction band $E_c$. There are various theories on this phenomenon, but it is basically considered that the phenomenon occurs because of reaction between a gate-electrode material and metal oxide of a high-κ dielectric caused by a thermal budget in a transistor process, which is Si—$HfO_2$ bonding in this case. This phenomenon is called Fermi-level pinning as described above.

FIG. 19 shows electron mobility in an nMOSFET using the gate insulating film 15A formed in this comparative example. FIG. 19 also shows cases where the Hf concentration x of hafnium silicate ($Hf_xSi_{1-x}O_4$) forming the gate insulating film 15A is 0 and 0.75. The ordinate represents the electron mobility μ ($cm^2$/Vs) and the abscissa represents the effective electric field E (MV/cm). As shown from FIG. 19, in the case where the Hf concentration x is 0.75 (△), the electron mobility decreases by about 30%, as compared to the case (●) where the Hf concentration x is zero. This relates to the phenomenon that mobility decreases in a region under the metal oxide film 15, i.e., the channel region of the semiconductor substrate described above. This results from that the metal concentration in the metal oxide film made of a high-κ dielectric is high near channel.

Figure 20:
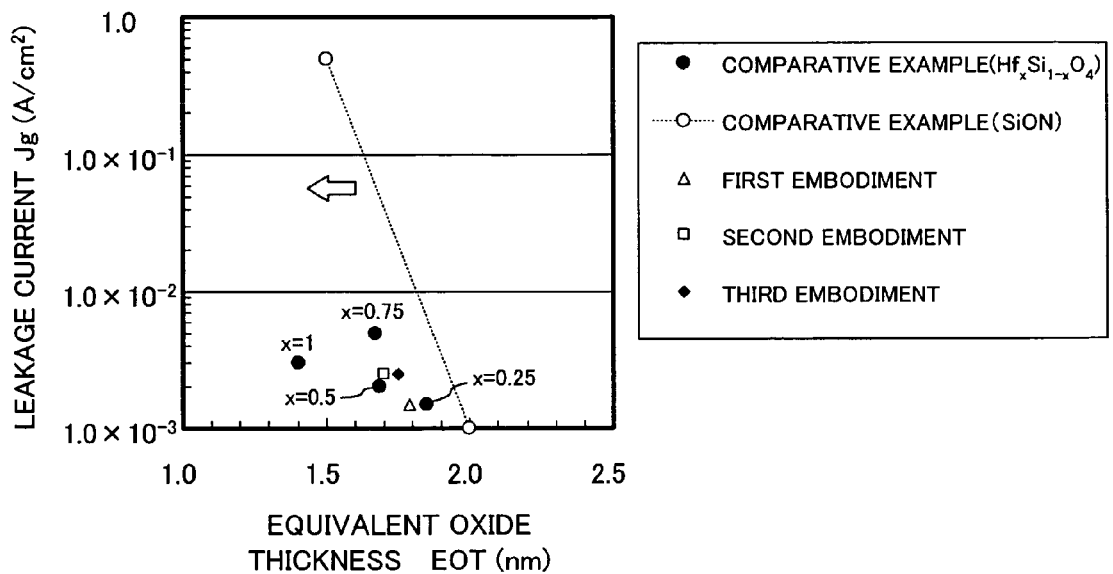
FIG. 20 is a graph showing a relationship between leakage current and equivalent oxide thickness in MOSFETs using gate insulating films formed in the first through third embodiments and the comparative example.

FIG. 20 shows a relationship between the leakage current $J_g$ and the equivalent oxide thickness EOT of the nMOSFET using the gate insulating film 15A formed in this comparative example. In FIG. 20, all the samples shown in FIG. 16 are measured. The ordinate represents the leakage current $J_g$ ($A/cm^2$) and the abscissa represents the equivalent oxide thickness EOT (nm). As shown in FIG. 20, as compared to the case (○) of a gate insulating film of SiON not using a conventional high-κ material, the leakage current $J_g$ is reduced in all the samples having the equivalent oxide thickness EOT equal to that of SiON. More specifically, as the Hf concentration x is higher and the relative dielectric constant κ is larger in a sample, the effect of reduction of the equivalent oxide thickness EOT and the leakage current $J_g$ is great. In addition, it is shown that the leakage current $J_g$ increases only in the sample having a Hf concentration x of 0.75 because of the phase separation described above. In FIG. 20, a region at the left side of the broken line connecting marks ○ of the comparative example (SiON) indicated by the arrow is a region where the equivalent oxide thickness EOT is preferably smaller than that in the case of using $SiO_2$ (SiON) for the gate insulating film.

Figure 21:
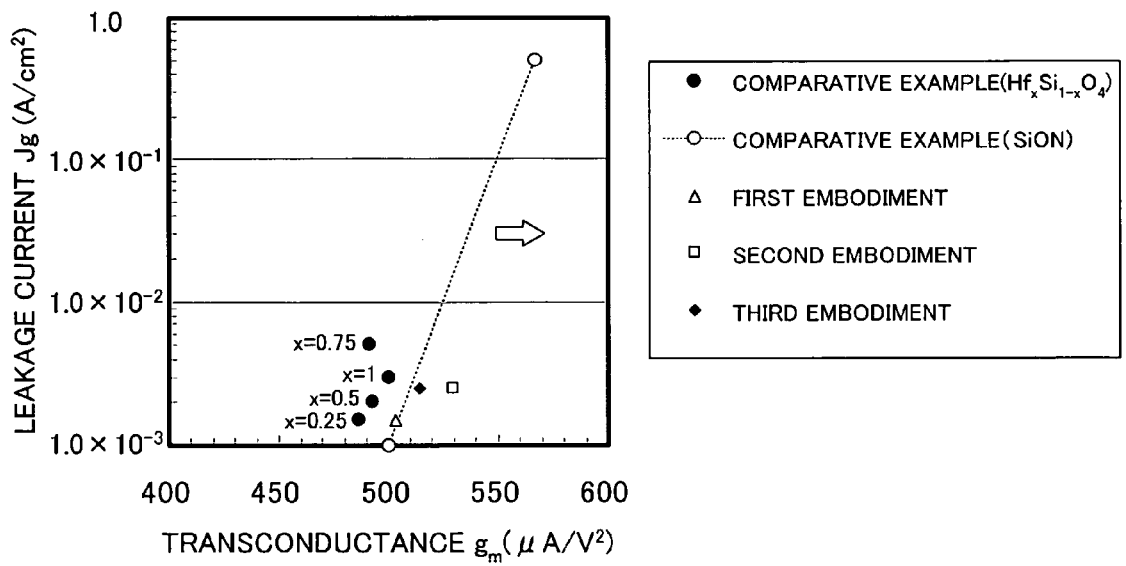
FIG. 21 is a graph showing a relationship between leakage current and transconductance in MOSFETs using gate insulating films formed in the first through third embodiments and the comparative example

FIG. 21 shows a relationship between leakage current $J_g$ and transconductance $g_m$ of the nMOSFET using the gate insulating film 15A formed in this comparative example. In this case, all the samples shown in FIG. 16 are measured. The ordinate represents leakage current $J_g$ ($A/cm^2$) and the abscissa represents transconductance $g_m$ ($\mu A/V^2$). The transconductance $g_m$ is an index of drivability during transistor operation, i.e., the differential value of ON current with respect to a gate voltage. The transconductance $g_m$ is approximately inversely proportional to the equivalent oxide thickness EOT and proportional to carrier mobility. As shown in FIG. 21, in the case (●) of using a gate insulating film of a high-κ dielectric, high-speed response with low power consumption, i.e., small leakage current $J_g$ and high transconductance $g_m$, is expected, as compared to the case (○) of using an SiON film as the gate insulating film. In this case, leakage current $J_g$ also increases only in the sample having a Hf concentration x of 0.75 because of the phase separation described above. The transconductance $g_m$ deviates to the left from the broken line representing the comparative example (SiON) because of decrease of mobility. The arrow at the right side of the broken line representing the comparative example (SiON) shown in FIG. 21 indicates a region where the transconductance $g_m$ is preferably higher than that in the case of using $SiO_2$ (SiON) for the gate insulating film.

Figure 22:
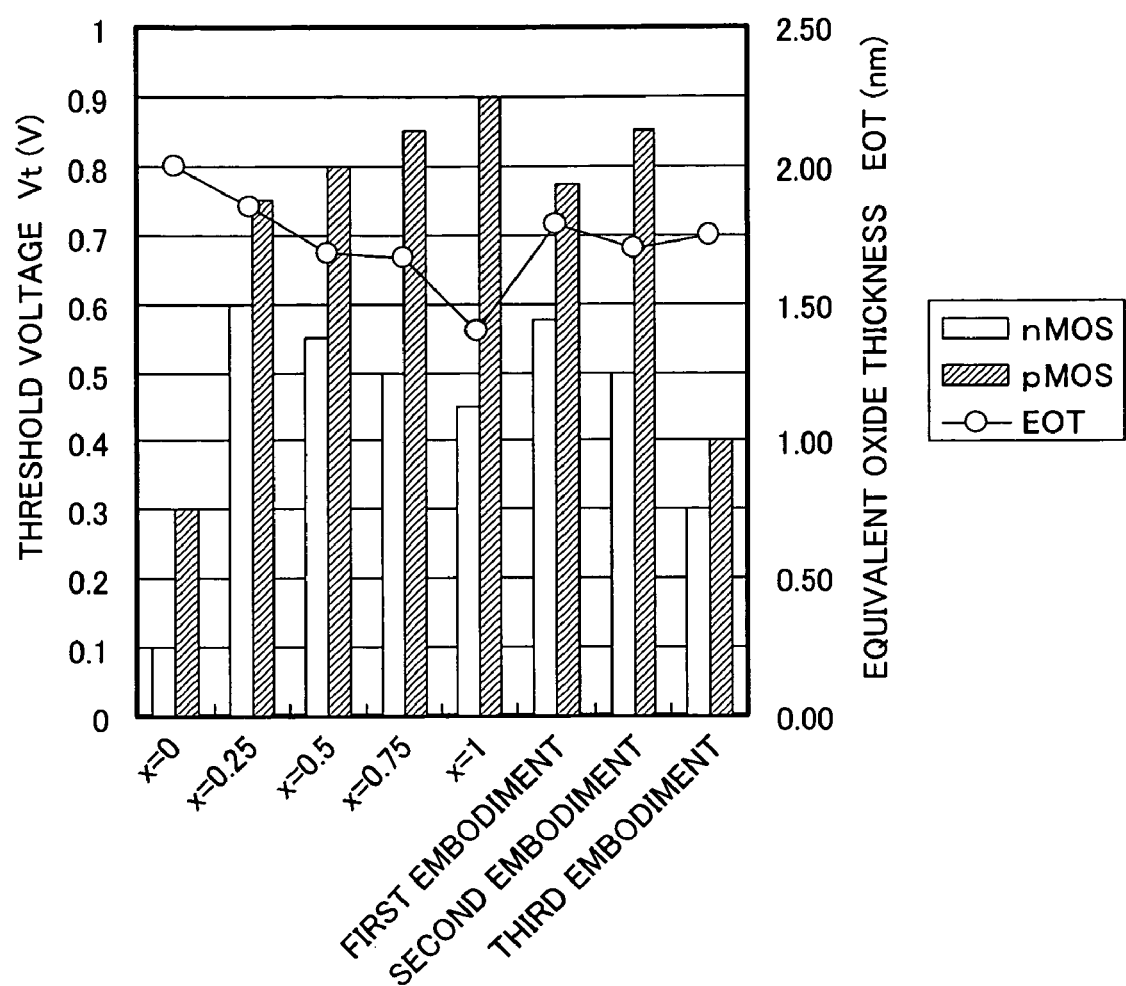
FIG. 22 is a graph showing measurement results on equivalent oxide thicknesses and the absolute values of threshold voltages of MOSFETs using gate insulating films formed in the first through third embodiments and the comparative example.

FIG. 22 shows measurement results on the equivalent oxide thicknesses EOT and the absolute values of the threshold voltages $V_t$ of the MOSFETs using the gate insulating films 15A formed in this comparative example for all the samples shown in FIG. 16. FIG. 22 shows that the equivalent oxide thickness EOT represented by the right ordinate is reduced as compared to the conventional SiON film approximately equivalent to x=0. However, the absolute values of the threshold voltages $V_t$ represented by the left ordinate are large for both the nMOSFET and the pMOSFET because of Fermi-level pinning, as also shown in the CV characteristic data in FIG. 17. Between these MOSFETs, the absolute value of the threshold voltage $V_t$ of the pMOSFET is especially large under the influence of fixed charge depending on the Hf concentration x. A large absolute value of the threshold voltage $V_t$ means that an effective voltage $V_g$ is less likely to be applied by application of a gate voltage $V_g$. Accordingly, as for the transconductance $g_m$, the threshold voltage characteristic of the structure using the gate insulating film 15A having a Hf concentration x of 0.25 or higher is inferior to that of the conventional structure using SiON for a gate insulating film.

As described above, the gate insulating film of the comparative example using metal oxide made of a high-κ dielectric does not fully exhibit electric properties because of problems such as occurrence of Fermi-level pinning in the upper interface of the gate insulating film and deterioration of carrier mobility in the lower interface of the gate insulating film. In addition, as in the example in which the Hf concentration x is 0.75, at a certain Hf concentration, the film is separated into phases: a more-stable high-κ phase (where x=1) and a low-κ phase (where x=0.5 or 0.25) because of thermal budgets during deposition and in a subsequent process. In addition, this phase separation occurs three-dimensionally, so that leakage current $J_g$ increases using a grain boundary generated by the phase separation as a leakage path, as described above.

Moreover, the high-κ phase is precipitated from the upper interface of the gate insulating film to the gate electrode or from the lower interface of the gate insulating film to the semiconductor substrate, so that the degrees of Fermi-level pinning and deterioration of carrier mobility might increase. This means that even if a graded structure in which metal (Hf) concentrations in the upper and lower interfaces of the gate insulating film and in portions near the interfaces are reduced is to be implemented so as to suppress the above phenomena, the phase separation can deteriorate properties contrarily.

Hereinafter, embodiments of the present invention will be described with reference to the drawings. In the embodiments, a structure in which only thermodynamically-stable phases are stacked in a gate insulating film made of a high-κ material in the thickness direction or the gate insulating film is separated into thermodynamically-stable phases in the thickness direction is employed so that Fermi-level pinning and deterioration of carrier mobility occurring in the comparative example are prevented.

EMBODIMENT 1

A semiconductor device according to a first embodiment of the present invention, which is a MOSFET including a gate insulating film made of high-κ metal oxide, will be described with reference to FIGS. 1 and 2.

Figure 1:
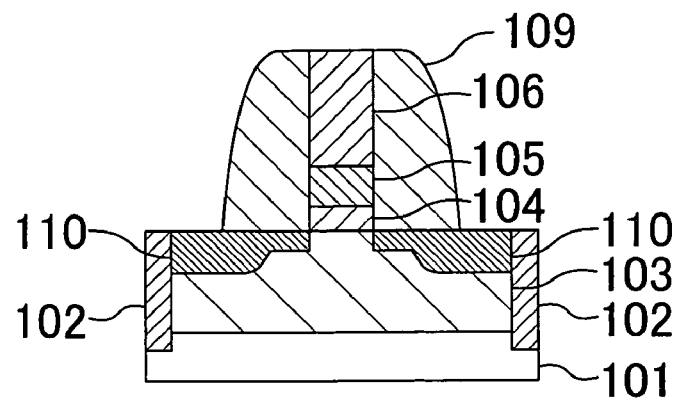
FIG. 1 is a cross-sectional view illustrating a structure of a semiconductor device according to a first embodiment of the present invention.

First, as shown in FIG. 1, an nMOSFET according to the first embodiment is formed in a transistor region surrounded by an isolation film 102 serving as a shallow trench isolation (STI) and selectively formed in an upper portion of a substrate 101 made of silicon (Si) having a principal surface whose plane orientation is the (100) plane, for example.

In the transistor region, a well 103 having a junction depth approximately equal to the lower end of the isolation film 102 is formed. The well 103 is of a p-type when the MOSFET is an n-transistor and is of an n-type when the MOSFET is a p-transistor.

An underlying film 104 made of silicon oxide ($SiO_2$) and having a thickness of about 0.5 nm, a gate insulating film 105 made of hafnium silicate ($Hf_xSi_{1-x}O_4$) and having a thickness of about 3.0 nm, a gate electrode 106 having a thickness of about 100 nm and made of polysilicon doped with phosphorus (P) in the case of the nMOSFET and with boron (B) in the case of the pMOSFET, and side walls 109 made of silicon oxide and formed on the both sides of the gate electrode 106, the gate insulating film 105 and the underlying film 104 are formed over the transistor region of the substrate 101.

Source/drain regions 110 including extended regions are formed in an upper portion of the well 103 and located at the both sides of the gate electrode 106. The gate length of the gate electrode 106 is 65 nm at the minimum.

The underlying film 104 provided between the gate insulating film 105 and the substrate 101 is not necessarily needed. However, the underlying film 104 is preferably provided because diffusion of an element of the gate insulating film 105 into the substrate 101 is prevented and deterioration of carrier mobility caused by a high-κ material is further suppressed.

Figure 2:
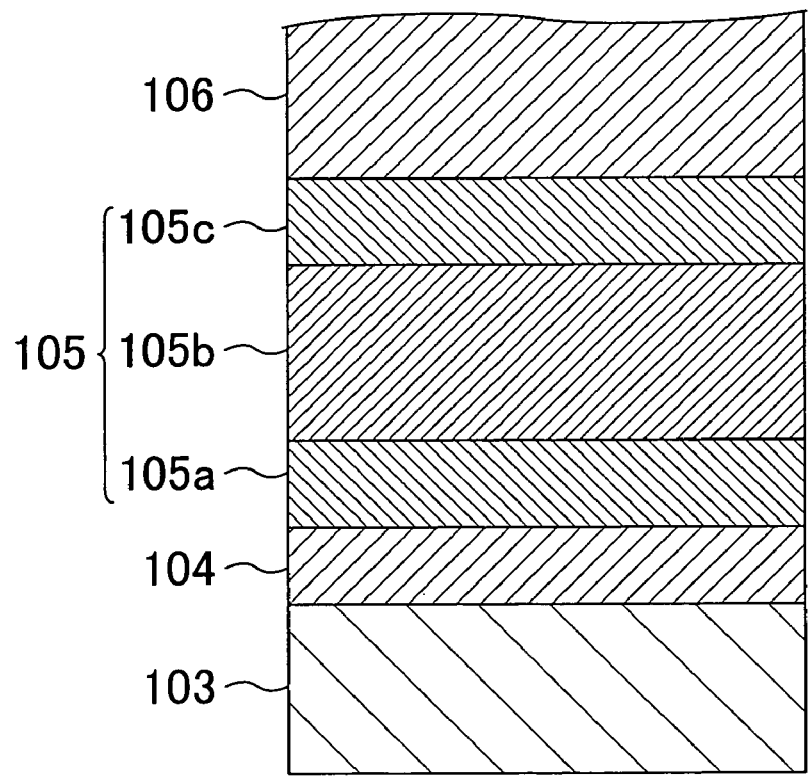
FIG. 2 is a partial cross-sectional view illustrating a gate insulating film and a portion near the gate insulating film in the semiconductor device of the first embodiment.

FIG. 2 illustrates a cross-sectional structure of the gate insulating film 105 of the MOSFET of the first embodiment and portions near the gate insulating film 105 in an enlarged manner. As illustrated in FIG. 2, the gate insulating film 105 is composed of a first metal oxide film 105a which is a low-κ stable phase having a Hf concentration x in hafnium silicate ($Hf_xSi_{1-x}O_4$) of 0.25 and has a thickness of 1.0 nm, a second metal oxide film 105b which is a high-κ stable phase having a Hf concentration x of 0.50 and has a thickness of 1.5 nm, and a third metal oxide film 105c which is a low-κ stable phase having a Hf concentration x of 0.25 and has a thickness of 0.5 nm.

Hereinafter, a method for fabricating an nMOSFET having the foregoing structure will be described with reference to FIGS. 3A through 3C.

Figure 3A:
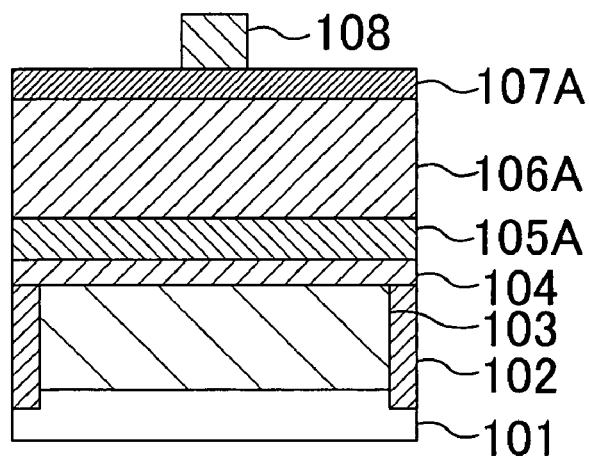
FIGS. 3A through 3C are cross-sectional views illustrating respective process steps of a method for fabricating a semiconductor device according to the first embodiment in the fabrication order.

First, as shown in FIG. 3A, an isolation film 102 serving as a shallow trench isolation (STI) is selectively formed in an upper portion of a substrate 101 made of silicon (Si) having a principal surface whose plane orientation is the (100) plane, for example. Subsequently, a p- or n-well 103 is formed by ion implantation in an upper portion of the substrate 101. In this manner, a plurality of device regions are formed in the principal surface of the substrate 101. Thereafter, the surface of the substrate 101 is subjected to known standard RCA cleaning and dilute hydrofluoric acid (HF) cleaning in this order. Then, heat treatment is performed on the substrate 101 whose surface has been cleaned, at a temperature of about 600° C. to about 700° C. in an oxygen atmosphere, for example. In this manner, an underlying film 104 made of silicon oxide ($SiO_2$) and having a thickness of about 0.5 nm is formed on the device regions in the substrate 101.

Next, a metal oxide film 105A made of a high-κ dielectric is deposited by, for example, a metal-organic chemical vapor deposition (MOCVD) process to a thickness of about 3 nm over the underlying film 104. As a metal element of the metal oxide film 105A, at least one material may be selected from the group consisting of silicon (Si), germanium (Ge), hafnium (Hf), zirconium (Zr), titanium (Ti), tantalum (Ta), aluminum (Al) and a rare-earth metal.

Specifically, for example, bubbling is performed by blowing a carrier gas containing, for example, nitrogen ($N_2$) into $Hf(O\text{-}t\text{-}C_3H_7)_4$ as a liquid Hf source and $Si(O\text{-}t\text{-}C_3H_7)_4$ as a liquid Si source. In this manner, a source gas in which the liquid Hf source and the liquid Si source are in gaseous form is introduced into a reaction chamber together with the carrier gas. Then, a metal oxide film 105A made of hafnium silicate ($Hf_xSi_{1-x}O_4$) is deposited with the temperature in the chamber set at about 500° C. At this time, as the metal oxide film 105A, a first metal oxide film 105a which is a low-κ stable phase having a Hf concentration x of 0.25 and has a thickness of 1.0 nm, a second metal oxide film 105b which is a high-κ stable phase having a Hf concentration x of 0.5 and has a thickness of 1.5 nm, and a third metal oxide film 105c which is a low-κ stable phase having a Hf concentration x of 0.25 and has a thickness of 0.5 nm are deposited in this order as illustrated in FIG. 2. The substrate temperature is kept at a low temperature enough to keep the stacked structure in an amorphous state at the deposition and, for example, in the range from about 400° C. to about 500° C. The substrate temperature during oxidation is also set at a low temperature enough to keep an amorphous state, as in the deposition. Thereafter, before deposition of a gate-electrode film, heat treatment is performed at a high temperature enough to cause phase separation into the metal stable phases 105a, 105b and 105c such that no additional three-dimensional phase separation occurs.

As a specific example of the high-temperature heat treatment, heat treatment is performed at a temperature of about 700° C. to about 1000° C. so as to remove a remaining impurity such as carbon (C) or hydrogen (H), to compensate deficiency by nitridation, and to make the film sustainable under a thermal budget in a subsequent high-temperature process. The heating atmosphere at this time is preferably a nitrogen ($N_2$) atmosphere or an ammonium ($NH_3$) atmosphere containing a trace amount of oxygen so as to prevent a large change in thickness of the underlying film 104 between the Si substrate 101 and the metal oxide film 105A.

To maintain the stacked structure illustrated in FIG. 2 without additional phase separation of the metal oxide film 105A or to prevent the supply of excessive nitrogen that is a cause of deterioration of carrier mobility to the interface of the substrate 101 with the underlying film 104, the heat treatment in an ammonium atmosphere is preferably performed at about 600° C. to about 800° C. This heat treatment is preferably performed after heat treatment has been performed at a higher temperature in an nitrogen atmosphere and the phase separation has been stabilized.

Subsequently, a gate-electrode film 106A made of polysilicon doped with, for example, phosphorus (P) with a thickness of about 100 nm and a hard-mask film 107A made of silicon oxide with a thickness of about 80 nm are deposited in this order by CVD processes over the metal oxide film 105A. Then, resist masks 108 having gate patterns are formed on the hard-mask film 107A by lithography.

Figure 3B:
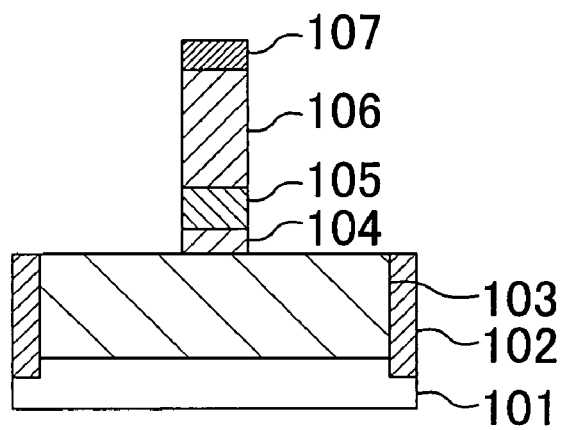
Figure 3C:
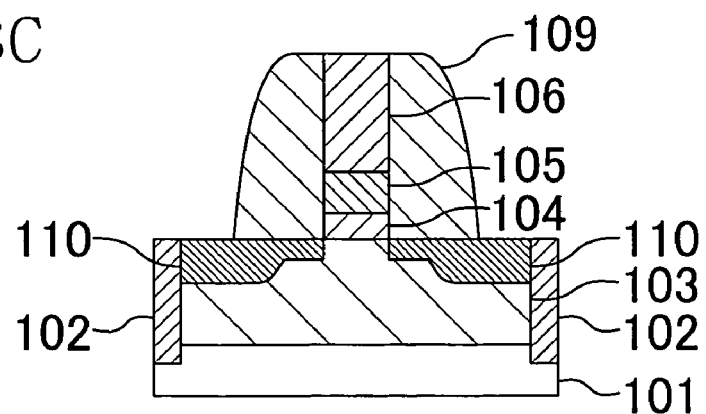

Thereafter, as shown in FIG. 3B, the hard-mask film 107A through the metal oxide film 105A are sequentially patterned by dry etching containing chlorine ($Cl_2$) gas, for example, as a main component and using the resist mask 108. In this manner, a hard mask 107 is formed out of the hard-mask film 107A, a gate electrode 106 is formed out of the gate-electrode film 106A, and a gate insulating film 105 is formed out of the metal oxide film 105A.

Then, ion implantation is performed on an upper portion of the substrate 101 using the hard mask 107. Subsequently, side walls 109 made of silicon oxide are formed on both sides of the gate electrode 106, and then ions are implanted again in an upper portion of the substrate 101 using the side walls 109 and the gate electrode 106 as a mask, thereby forming source/drain regions 110. Thereafter, through an interconnection process, an nMOSFET shown in FIG. 3C is obtained.

Figure 4:
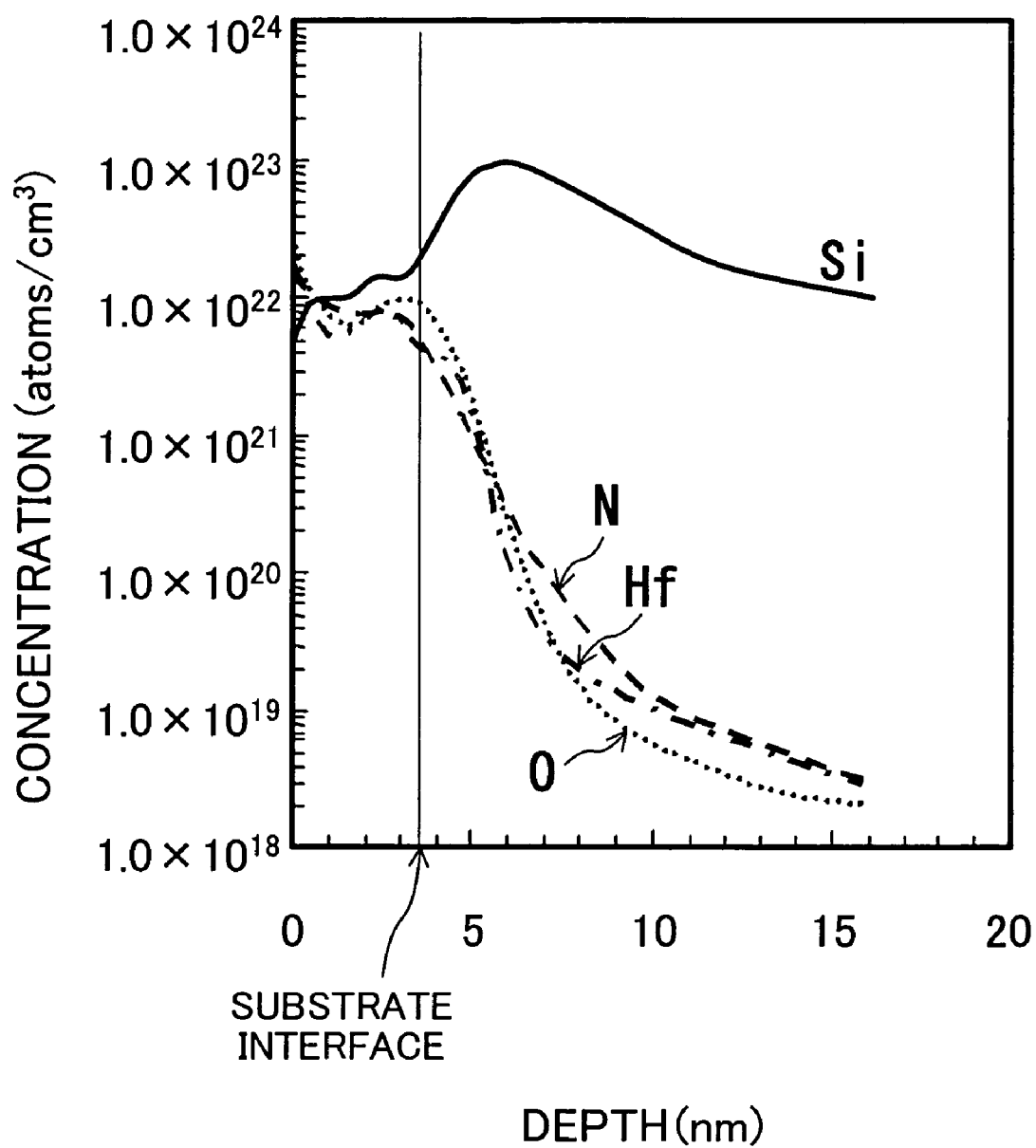
FIG. 4 is a graph showing a concentration profile of atoms after thermal nitridation of a metal oxide film for forming a gate insulating film in the semiconductor device of the first embodiment.

FIG. 4 shows a result of analysis of a concentration profile of atoms in a structure after the deposited metal oxide film 105A has been subjected to thermal nitridation in an ammonium atmosphere by secondary ion mass spectroscopy (SIMS). As shown in FIG. 4, nitrogen atoms reach the interface of the substrate 101 with the gate insulating film in some amount, but do not cause deterioration of carrier mobility.

FIG. 19 shows electron mobility in the nMOSFET including the gate insulating film 105 formed in the first embodiment, together with the comparative examples. FIG. 19 shows cases where the Hf concentration x of hafnium silicate ($Hf_xSi_{1-x}O_4$) forming the gate insulating film 15A is 0 and 0.75 as the comparative examples. The degree of deterioration of carrier mobility is determined by the metal (Hf) concentration x in the substrate 101 at the interface with the gate insulating film 105 and portions near the interface. In this embodiment, it is substantially considered that x=0.25. Accordingly, the degree of deterioration of carrier mobility is much lower than that in the case where the Hf concentration x is 0.75 in the comparative example and is about 10% of deterioration in the case of a gate insulating film of SiON corresponding to x=0.

FIG. 20 shows a relationship between leakage current $J_g$ and equivalent oxide thickness EOT of the nMOSFET including the gate insulating film 105 formed in the first embodiment, together with the comparative examples. FIG. 20 shows that the MOSFET of the first embodiment has the same trend as the comparative examples except for the sample having a Hf concentration x of 0.75, and leakage currents $J_g$ are reduced at the same equivalent oxide thickness EOT, as compared to the conventional SiON film. This shows that even if the gate insulating film 105 is separated into phases, leakage current $J_g$ is suppressed as long as the separated phases are controlled only in the thickness direction (i.e., the direction perpendicular to the principal surface of the substrate 101), i.e., the grain boundary is controlled in the direction parallel to the principal surface of the substrate 101.

FIG. 21 shows a relationship between leakage current $J_g$ and transconductance $g_m$ in the nMOSFET including the gate insulating film 105 formed in the first embodiment, together with the comparative examples. As described above, the transconductance $g_m$ is approximately inversely proportional to the equivalent oxide thickness EOT and proportional to carrier mobility. From the comparative example having a Hf concentration x of 0.25, it is considered that the degree of deterioration of carrier mobility is kept at about 10% of that of SiON. Since the equivalent oxide thickness EOT accords with the trend in the range of 0.25<x<0.5 in FIG. 20, transconductance $g_m$ in the MOSFET of the first embodiment is higher than those in the comparative examples and equivalent to the $g_m$ property of the conventional SiON film.

FIG. 22 shows measurement results on the equivalent oxide thickness EOT and the absolute value of the threshold voltage $V_t$ of the MOSFET including the gate insulating film 105 formed in the first embodiment, together with the conventional examples. The absolute value of the threshold voltage $V_t$ is determined by Fermi-level pinning and the interaction between the third metal oxide film 105c having a Hf concentration x of 0.25 and the gate electrode 106 and is also determined by internal fixed charge in accordance with the trend of the Hf concentration x in the range of 0.25<x<0.5. Accordingly, as shown in FIG. 22, in the case of using the gate insulating film 105 for a pMOSFET, the increase of the threshold value of the pMOSFET is suppressed for the equivalent oxide thickness EOT, as compared to the comparative examples, though the suppression is inferior to that in the conventional SiON film.

As described above, the first embodiment employs, as the gate insulating film 105 made of a high-κ dielectric, a stacked structure including: the first metal oxide film 105a of a low-κ stable phase, the second metal oxide film 105b of a high-κ stable phase and the third metal oxide film 105c of a low-κ stable phase, which are stacked in this order over the substrate. Accordingly, Fermi-level pinning occurring in the gate insulating film 105 at the interface with the gate electrode 106 is suppressed by the low-κ stable phase that is the third metal oxide film 105c. In addition, deterioration of carrier mobility occurring in a portion of the substrate 101 under the gate insulating film 105 is suppressed by the low-κ stable phase that is the first metal oxide film 105a. At the same time, increase of the equivalent oxide thickness EOT is suppressed by the high-κ stable phase that is the second metal oxide film 105b. As a result, the transconductance $g_m$ that is an index of drivability during transistor operation is restored to the degree of a gate insulating film using the conventional SiON film. The threshold voltage $V_t$ is also improved as compared to the comparative examples.

EMBODIMENT 2

Figure 5:
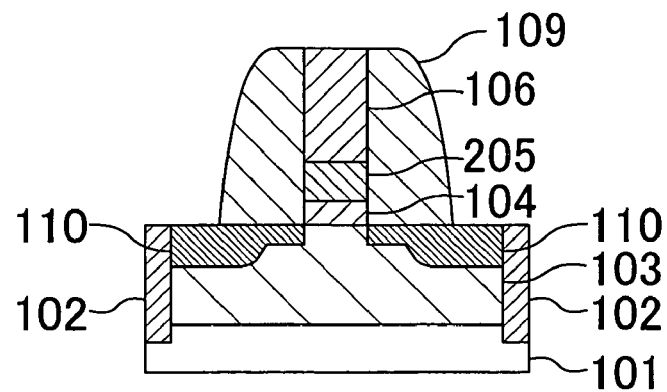
FIG. 5 is a cross-sectional view illustrating a structure of a semiconductor device according to a second embodiment of the present invention.
Figure 6:
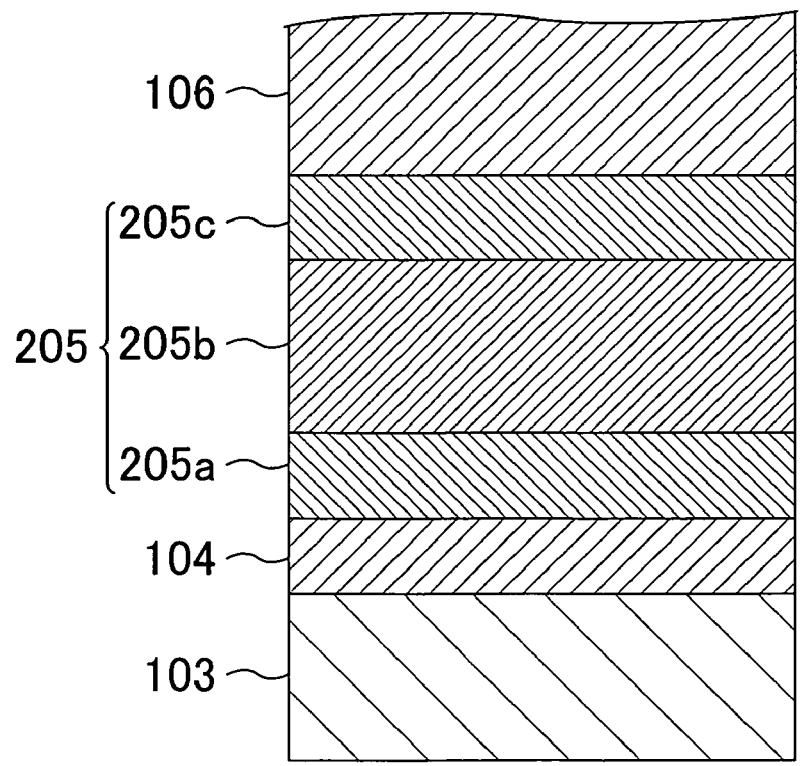
FIG. 6 is a partial cross-sectional view illustrating a gate insulating film and a portion near the gate insulating film in the semiconductor device of the second embodiment.

Hereinafter, a semiconductor device according to a second embodiment of the present invention, which is a MOSFET including a gate insulating film made of high-κ metal oxide, will be described with reference to FIGS. 5 and 6. In FIGS. 5 and 6, components also shown in FIG. 1 are denoted by the same reference numerals, and description thereof will be omitted.

In the second embodiment, as illustrated in an enlarged partial cross-sectional view of FIG. 6, a gate insulating film 205 made of high-κ metal oxide, i.e., hafnium silicate ($Hf_xSi_{1-x}O_4$), is composed of a first metal oxide film 205a of a low-κ stable phase having a Hf concentration x of 0.25 with a thickness of 1.0 nm, a second metal oxide film 205b of a high-κ stable phase having a Hf concentration x of 1 with a thickness of 1.5 nm, and a third metal oxide film 205c of a low-κ stable phase having a Hf concentration x of 0.25 with a thickness of 0.5 nm.

In the second embodiment, the gate insulating film 205 is deposited by an atomic layer deposition (so-called ALD) process.

Specifically, for example, a carrier gas such as nitrogen is supplied with hafnium tetrachloride ($HfCl_4$) as a solid hafnium (Hf) source or hexachlorodisilane ($Si_2Cl_6$) as a solid silicon (Si) source heated to high temperature. To deposit an atomic layer, first, $HfCl_4$ or $Si_2Cl_6$ is supplied onto an underlying film 104 so that dangling bonds in the surface of the underlying film 104 are terminated. Then, water ($H_2O$) is supplied so that new dangling bonds are terminated by hydroxyl (OH) groups. Deposition of $HfCl_4$ or $Si_2Cl_6$ and deposition of $H_2O$ are alternately repeated in cycles, thereby obtaining one atomic layer. Accordingly, the composition of metal oxide is controlled by alternately supplying materials in a cycle or at an atomic-layer level. Different from the MOCVD process used in the first embodiment, deposition can be performed at a relatively low substrate temperature of about 300° C. to about 400° C.

First, as in the first embodiment, an underlying film 104 is deposited on the principal surface of a substrate 101. Then, a first metal oxide film 205a which is a low-κ stable phase having a Hf concentration x of 0.25 and has a thickness of 1.0 nm, a second metal oxide film 205b which is a high-κ stable phase having a Hf concentration x of 1 and has a thickness of 1.5 nm, and a third metal oxide film 205c which is a low-κ stable phase having a Hf concentration x of 0.25 and has a thickness of 0.5 nm are deposited in this order, thereby obtaining a metal oxide film having a physical thickness of 3 nm.

Then, as in the first embodiment, heat treatment is performed at a temperature of about 700° C. to about 1000° C. so as to remove a remaining impurity such as chlorine, to compensate deficiency by nitridation, and to make the film sustainable under a thermal budget in a subsequent high-temperature process. The heat treatment in an ammonium atmosphere is preferably performed at a temperature of about 600° C. to about 800° C., and is preferably performed after high-temperature heat treatment in a nitrogen atmosphere has been performed and phase separation has been stabilized. Thereafter, in the same manner as in the first embodiment, a MOSFET illustrated in FIG. 5 is obtained.

FIG. 20 shows a relationship between leakage current $J_g$ and equivalent oxide thickness EOT of an nMOSFET including the gate insulating film 205 formed in the second embodiment, together with the comparative examples and the first embodiment. FIG. 20 shows that the MOSFET of the second embodiment has the same trend as the first embodiment and the comparative examples except for the sample having a Hf concentration x of 0.75, and leakage currents $J_g$ are reduced at the same equivalent oxide thickness EOT, as compared to the conventional SiON film. This shows that even if the gate insulating film 205 is separated into phases, leakage current $J_g$ is suppressed as long as the separated phases are controlled only in the thickness direction (i.e., the direction perpendicular to the principal surface of the substrate 101), i.e., the grain boundary is controlled in the direction parallel to the principal surface of the substrate 101.

FIG. 21 shows a relationship between leakage current $J_g$ and transconductance $g_m$ in the nMOSFET including the gate insulating film 205 formed in the second embodiment, together with the comparative examples and the first embodiment. As in the first embodiment shown in FIG. 19, from the example having a Hf concentration x of 0.25, it is considered that the degree of deterioration of carrier mobility is kept at about 10% of that of SiON. Since the equivalent oxide thickness EOT accords with the trend in the range of 0.50<x<0.75 in FIG. 20, transconductance $g_m$ in the MOSFET of the second embodiment is higher than those in the comparative examples and the first embodiment and even exceeds the $g_m$ property of the conventional SiON film.

FIG. 22 shows measurement results on the equivalent oxide thickness EOT and the absolute value of the threshold voltage $V_t$ of the MOSFET including the gate insulating film 205 formed in the second embodiment, together with the conventional examples and the first embodiment. In the MOSFET of the second embodiment, the absolute value of the threshold voltage $V_t$ is determined by Fermi-level pinning and the interaction between the third metal oxide film 205c having a Hf concentration x of 0.25 and a gate electrode 106 and is also determined by internal fixed charge in accordance with the trend of the Hf concentration x in the range of 0.50<x<0.75. Accordingly, as shown in FIG. 22, in the case of using the gate insulating film 205 for a pMOSFET, the increase of the threshold value of the pMOSFET is suppressed for the equivalent oxide thickness EOT, as compared to the comparative examples, though the suppression is inferior to that in the conventional SiON film and the first embodiment.

As described above, the second embodiment employs, as the gate insulating film 205 of a high-κ dielectric, a stacked structure including: the first metal oxide film 205a of a low-κ stable phase, the second metal oxide film 205b of a high-κ stable phase and the third metal oxide film 205c of a low-κ stable phase, which are stacked in this order over the substrate. Accordingly, Fermi-level pinning occurring in the gate insulating film 205 at the interface with the gate electrode 106 is suppressed by the low-κ stable phase that is the third metal oxide film 205c. In addition, deterioration of carrier mobility occurring in a portion of the substrate 101 under the gate insulating film 205 is suppressed by the low-κ stable phase that is the first metal oxide film 205a. At the same time, increase of the equivalent oxide thickness EOT is suppressed by the high-κ stable phase that is the second metal oxide film 205b. As a result, the transconductance $g_m$ that is an index of drivability during transistor operation increases to exceed that of the gate insulating film using the conventional SiON film. The threshold voltage $V_t$ is also improved as compared to the comparative examples.

EMBODIMENT 3

Figure 7:
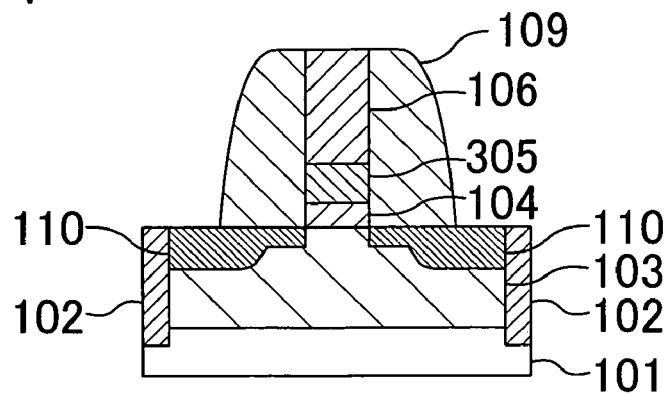
FIG. 7 is a cross-sectional view illustrating a structure of a semiconductor device according to a third embodiment of the present invention.
Figure 8:
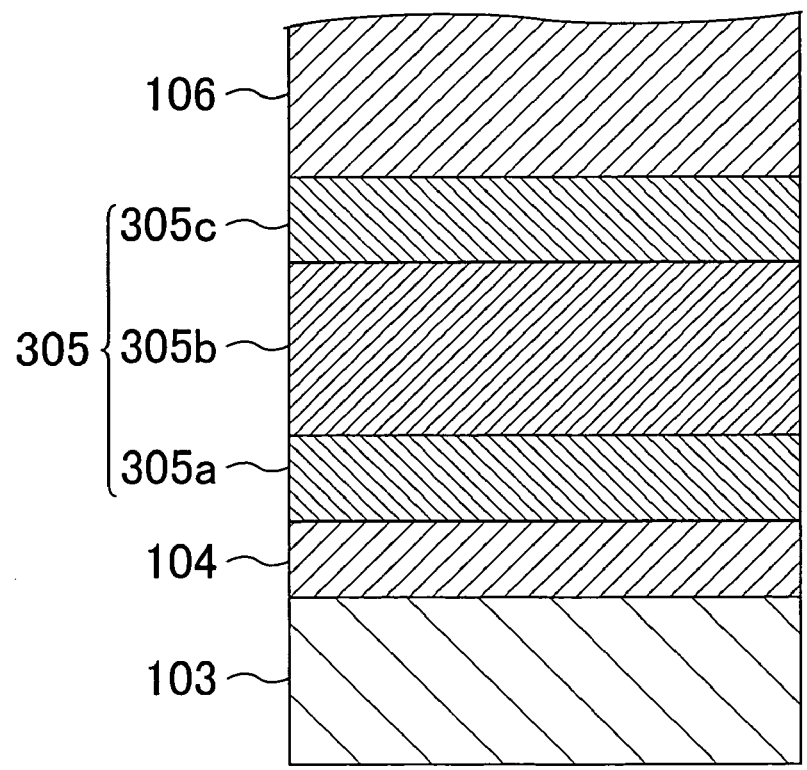
FIG. 8 is a partial cross-sectional view illustrating a gate insulating film and a portion near the gate insulating film in the semiconductor device of the third embodiment.

Hereinafter, a semiconductor device according to a third embodiment of the present invention, which is a MOSFET including a gate insulating film made of high-κ metal oxide, will be described with reference to FIGS. 7 and 8. In FIGS. 7 and 8, components also shown in FIG. 1 are denoted by the same reference numerals, and description thereof will be omitted.

In the third embodiment, as illustrated in an enlarged partial cross-sectional view of FIG. 8, a gate insulating film 305 made of high-κ metal oxide, i.e., hafnium silicate ($Hf_xSi_{1-x}O_4$) is composed of a first metal oxide film 305a of a low-κ stable phase having a Hf concentration x of 0.25 with a thickness of 1.0 nm, a second metal oxide film 305b of a high-κ stable phase having a Hf concentration x of 1 with a thickness of 1.5 nm, and a third metal oxide film 305c of a low-κ stable phase having a Hf concentration x of 0 with a thickness of 0.5 nm.

Now, a method for fabricating a MOSFET with the foregoing structure will be described with reference to FIGS. 9A through 9C. In the third embodiment, the gate insulating film 305 is deposited by a physical vapor deposition (PVD) process.

Figure 9A:
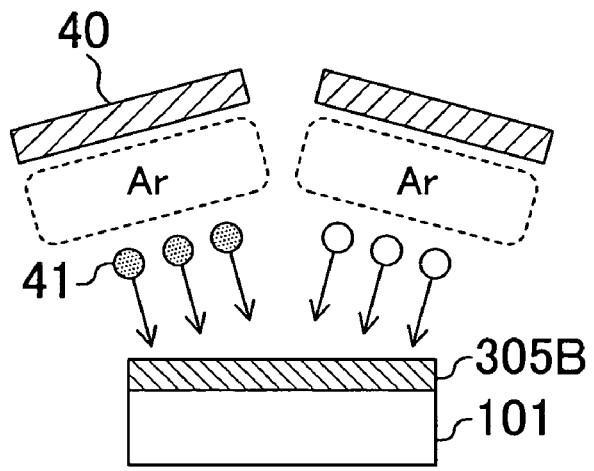
FIGS. 9A through 9C are cross-sectional views illustrating respective process steps of a method for forming a metal oxide film for a gate insulating film in the semiconductor device according to the third embodiment in the formation order.

Specifically, first, as shown in FIG. 9A, an underlying film (not shown) made of silicon oxide is deposited on the principal surface of a substrate 101 in the same manner as in the first embodiment. Then, multi-target sputtering is performed using at least a first target source 40 made of metal hafnium (Hf) and a second target source 50 made of metal silicon (Si), thereby depositing an alloy film 305B made of at least two elements of Hf and Si. At this time, the composition of the alloy film 305B is changed in the thickness direction.

Specifically, for example, the first target source 40 and the second target source 50 are subjected to simultaneous sputtering with which a DC voltage is applied in an atmosphere substantially containing no oxygen, e.g., an inert atmosphere of argon (Ar) gas together with discharge, thereby forming an alloy film 305B of Hf/Si. In this case, the alloy film 305B made of 41 Hf atoms and 51 Si atoms and having a composition of Hf/Si=3/1 and a thickness of 1.5 nm is obtained by adjusting power supplied to the target sources 40 and 50 and the sputtering time. To control the composition in more detail, as the alloy film 305B, an alloy layer having a thickness of 0.5 nm and a Hf concentration x of 0.25, a Hf layer having a thickness of 1 nm and a Hf concentration x of 1, and a Si layer having a thickness of 0.2 nm and a Hf concentration x of 0 are deposited in this order. Through subsequent thermal oxidation, the alloy film 305B is changed into a metal oxide film 305A having a thickness about 1.5 to 2 times as large as that of the alloy film 305B.

In the formation of the alloy film 305B, the substrate 101 is not preferably heated to high temperature, e.g., to less than 300° C., for the purpose of suppressing formation of a mixed layer in which Hf atoms are mixed into the substrate 101 at the interface between the metal Hf layer and the silicon substrate 101 and also suppressing subsequent oxidation.

Figure 9B:
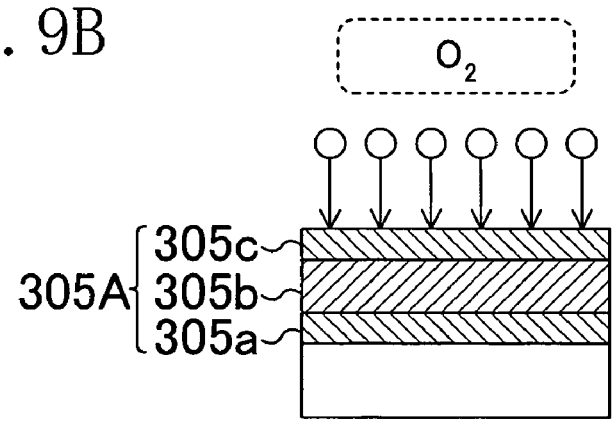

Next, as shown in FIG. 9B, the deposited alloy film 305B is subjected to thermal oxidation in an oxidizing atmosphere, thereby obtaining a metal oxide film 305A made of a high-κ dielectric. Specifically, the surface of the alloy film 305B is processed in an atmosphere mainly containing oxygen radicals 61. In this case, a considerable number of non-activated oxygen atoms (molecules) 60 are contained. Through the oxidation in this oxidizing atmosphere, the metal oxide film 305A for forming a gate insulating film having a stoichiometric composition is obtained. In this manner, a stacked structure including the first metal layer 305a and the third metal layer 305c both of the low-κ stable phases toward the substrate 101 and a gate electrode 106, respectively, with the second metal layer 305b of the high-κ stable phase interposed therebetween is formed as the metal oxide film 305A in a self-aligned manner.

As apparatus for generating oxygen radicals, plasma generating apparatus or ozone generating apparatus may be used. To obtain the metal oxide film 305A by supplying oxygen atoms (molecules) 60, it is necessary to perform heat treatment at a temperature of several hundreds Celsius degrees or higher in an oxygen atmosphere. Accordingly, in this case, supply of oxygen not only to the alloy film 305B but also to the interface between the substrate 101 and the underlying layer cannot be avoided, so that crystallization occurs at the same time. On the other hand, the use of oxygen radicals 61 is preferable because oxygen radicals 61 has a chemical reactivity higher than oxygen atoms (molecules) 60, and oxidation occurs at a relatively low temperature of 300° C. to 500° C. Accordingly, with the thermal oxidation using oxygen radicals 61, crystallization hardly proceeds and the metal oxide film 305A remains in an amorphous state.

Figure 9C:
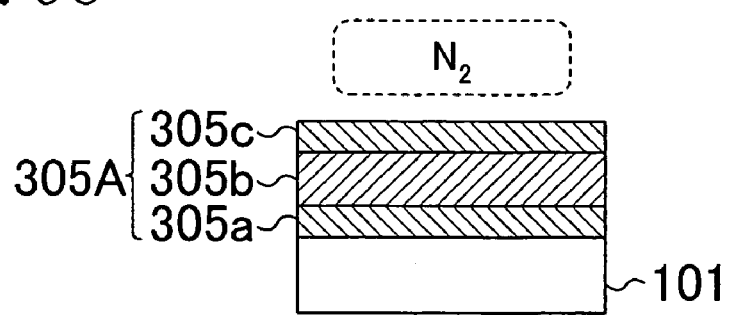

Then, as shown in FIG. 9C, as in the first embodiment, heat treatment is performed at a temperature of about 700° C. to about 1000° C. so as to remove a remaining impurity such as C or H, to compensate deficiency by nitridation, and to make the film sustainable under a thermal budget in a subsequent high-temperature process. The heat treatment in an ammonium atmosphere is preferably performed at a temperature of about 600° C. to about 800° C., and is preferably performed after high-temperature heat treatment in a nitrogen atmosphere has been performed and phase separation has been stabilized. Through the nitridation process, as the metal oxide film 305A for forming a gate insulating film, a structure including: a first metal oxide film 305a of a low-κ stable phase having a Hf concentration x of 0.25 with a thickness of 1.0 nm; a second metal oxide film 305b of a high-κ stable phase having a Hf concentration x of 1 with a thickness of 1.5 nm;

and a third metal oxide film 305c of a low-κ stable phase having a Hf concentration x of 0 with a thickness of 0.5 nm is obtained. Thereafter, in the same manner as in the first embodiment, a MOSFET illustrated in FIG. 7 is obtained.

Figure 10:
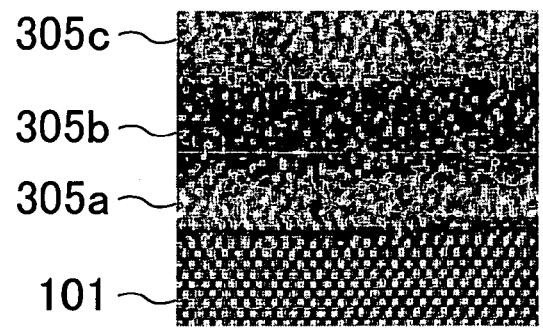
FIG. 10 is a transmission electron microscope photograph showing the metal oxide film for a gate insulating film in the semiconductor device of the third embodiment.

In this manner, as a feature not found in the first and second embodiments, the metal oxide film 305A has the property of being separated into phases in the thickness direction in a self-alight manner during oxidation and subsequent high-temperature heat treatment, as shown in a transmission electron microscope (TEM) photograph in FIG. 10. By utilizing this property, the first metal oxide film 305a and the third metal oxide film 305c both of low-κ stable phases are precipitated to the lower interface and the upper interface, respectively, in a self-aligned manner by phase separation. Accordingly, the resultant gate insulating film 305 has a property which is more excellent than a film formed by depositing new films such as buffer films at the upper face and the lower face of the metal oxide film 305A.

FIG. 20 shows a relationship between leakage current $J_g$ and equivalent oxide thickness EOT of an nMOSFET including the gate insulating film 305 formed in the third embodiment, together with the comparative examples and the first and second embodiments. FIG. 20 shows that the MOSFET of the third embodiment has the same trend as the first and second embodiments and the comparative examples except for the sample having a Hf concentration x of 0.75, and leakage currents $J_g$ are reduced at the same equivalent oxide thickness EOT, as compared to the conventional SiON film. This shows that even if the gate insulating film 305 is separated into phases, leakage current $J_g$ is suppressed as long as the separated phases are controlled only in the thickness direction (i.e., the direction perpendicular to the principal surface of the substrate 101), i.e., the grain boundary is controlled in the direction parallel to the principal surface of the substrate 101.

FIG. 17 shows a capacitance-voltage (CV) characteristic of the gate insulating film 305 formed in the third embodiment, together with the comparative examples (where x=0, 0.75). As shown in FIG. 17, with respect to the CV curves of MOSFETs according to the third embodiment, in both cases of the pMOSFET and the nMOSFET, the absolute values of the flat band voltages $V_{fb}$ are large whereas the absolute values of the threshold voltages $V_t$ are small, as compared to the case where the Hf concentration is 0.75, which is the comparative example in which Fermi-level pinning is pronounced. Accordingly, these cases are close to the comparative example where the Hf concentration is zero, i.e., the case of SiON.

Occurrence of Fermi-level pinning is substantially determined by interaction between the film at the upper interface of the gate insulating film 305 having a Hf concentration x of zero, i.e., SiON, and the gate electrode 106. From FIG. 17, it is shown that the coverage and the function as a barrier of SiON obtained in a self-aligned manner by the fabrication method of the third embodiment are high. It cannot be denied that the low-κ stable phase of SiON forming the upper part of the gate insulating film 305 reduces the capacitance of the gate insulating film 305 as a whole because of its low dielectric constant.

FIG. 21 shows a relationship between leakage current $J_g$ and transconductance $g_m$ in the nMOSFET including the gate insulating film 305 formed in the third embodiment, together with the comparative examples and the first and second embodiments. As in the first embodiment shown in FIG. 19, from the example having a Hf concentration x of 0.25, it is considered that the degree of deterioration of carrier mobility is kept at about 10% of that of SiON. In addition, since the equivalent oxide thickness EOT accords with the trend in the range of 0.25<x<0.50 in FIG. 20, transconductance $g_m$ in the MOSFET of the third embodiment is higher than those in the comparative examples but is approximately equal to that of the first embodiment, and exhibits a property substantially equivalent to that of the conventional SiON film.

FIG. 22 shows measurement results on the equivalent oxide thickness EOT and the absolute value of the threshold voltage $V_t$ of the MOSFET including the gate insulating film 305 formed in the third embodiment, together with the conventional examples and the first and second embodiments. In the MOSFET of the third embodiment, the absolute value of the threshold voltage $V_t$ is determined by Fermi-level pinning and the interaction between the third metal oxide film 305c having a Hf concentration x of 0, i.e., equivalent to SiON, and the gate electrode 106 and is also determined by internal fixed charge in accordance with the trend of the Hf concentration x in the range of 0.25<x<0.5. Accordingly, as shown in FIG. 22, in the MOSFET of the third embodiment using the gate insulating film 305, the increase of the threshold voltage $V_t$ is greatly suppressed, as compared to the comparative examples and the other embodiments. In addition, the suppression is only slightly inferior to that in the conventional SiON film. The difference by such a degree can be absorbed by controlling a short-channel characteristic.

As described above, the third embodiment employs, as the gate insulating film 305 of a high-κ dielectric, a stacked structure including: the first metal oxide film 305a of a low-κ stable phase, the second metal oxide film 305b of a high-κ stable phase and the third metal oxide film 305c of a low-κ stable phase, which are formed in this order in a self-aligned manner over the substrate. Accordingly, Fermi-level pinning occurring in the gate insulating film 305 at the interface with the gate electrode 106 is suppressed by the low-κ stable phase that is the third metal oxide film 305c. In addition, deterioration of carrier mobility occurring in a portion of the substrate 101 under the gate insulating film 305 is suppressed by the low-κ stable phase that is the first metal oxide film 305a. At the same time, increase of the equivalent oxide thickness EOT is suppressed by the high-κ stable phase that is the second metal oxide film 305b. As a result, the transconductance $g_m$ that is an index of drivability during transistor operation increases to the degree of the gate insulating film using the conventional SiON film. The threshold voltage $V_t$ is also improved as compared to the comparative example.

According to the present invention, in a transistor including a gate insulating film using a high-κ material, deterioration of carrier mobility and increase of the absolute value of the threshold voltage are prevented and thermodynamically-stable characteristics are obtained. Therefore, the present invention is useful for, for example, semiconductor devices including gate insulating films made of high-κ materials and methods for fabricating the devices.

What is claimed is:

1. A method for fabricating a semiconductor device, the method comprising the steps of:
    forming, by atomic layer deposition, a gate insulating film made of a plurality of high-dielectric-constant thin films at a thermodynamically-stable atomic-layer ratio and having different dielectric constants, on a semiconductor substrate; and
    forming a gate electrode on the gate insulating film,
    wherein the gate insulating film is composed of phases stacked perpendicularly to a principal surface of the semiconductor substrate;
    wherein in the step of forming the gate insulating film, each of the high-dielectric-constant thin films is deposited at a temperature at which an amorphous state of the high-dielectric-constant thin film is maintained, and the method further comprises the step of performing a heat treatment on the gate insulating film at a temperature enough to make each of the phases stable, before the step of forming the gate electrode, and performing nitridation on the gate insulating film, between the step of performing the heat treatment at a temperature at which the phases are stable and the step of forming the gate electrode.

2. The method for fabricating the semiconductor device of claim 1, wherein in the gate insulating film, one of the layers associated with a first stable phase having a low dielectric constant is located on the semiconductor substrate.

3. The method for fabricating the semiconductor device of claim 1, wherein in the gate insulating film, one of the layers associated with a first stable phase having a low dielectric constant is located on the gate electrode.

4. The method for fabricating the semiconductor device of claim 1, wherein the gate electrode is made of polysilicon, and the high-dielectric-constant material contains at least one material selected from the group consisting of silicon, germanium, hafnium, zirconium, titanium, tantalum, aluminum and a rare-earth metal.

5. The method for fabricating the semiconductor device of claim 1, wherein the high-dielectric-constant material is made of hafnium silicate (Hf$_x$Si$_{1-x}$O$_4$), a Hf concentration x of the first stable phase is $0.1<x<0.4$, and a Hf concentration x of a second stable phase associated with another layer in the gate insulating film is 0.5 or 1.0.

* * * * *